United States Patent
Kim et al.

(10) Patent No.: US 12,396,282 B2
(45) Date of Patent: Aug. 19, 2025

(54) IMAGE SENSOR

(71) Applicant: Samsung Electronics Co., Ltd., Suwon-si (KR)

(72) Inventors: Minkwan Kim, Hwaseong-si (KR); Chang Kyu Lee, Hwaseong-si (KR); In Sung Joe, Seoul (KR); Junhong Kim, Suwon-si (KR); Jinsun Pyo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 464 days.

(21) Appl. No.: 17/856,140

(22) Filed: Jul. 1, 2022

(65) Prior Publication Data

US 2023/0120066 A1  Apr. 20, 2023

(30) Foreign Application Priority Data

Oct. 20, 2021  (KR) .................. 10-2021-0140408

(51) Int. Cl.
 *H01L 27/146* (2006.01)
 *H10F 39/00* (2025.01)

(52) U.S. Cl.
 CPC ....... *H10F 39/807* (2025.01); *H10F 39/8053* (2025.01); *H10F 39/8063* (2025.01); *H10F 39/811* (2025.01)

(58) Field of Classification Search
 CPC ............... H10F 39/807; H10F 77/1243; H10F 30/2215; H10F 39/028; H10F 39/18; H10F 71/128; H10F 77/148
 See application file for complete search history.

(56) References Cited

U.S. PATENT DOCUMENTS

| | | | | |
|---|---|---|---|---|
| 6,850,278 | B1* | 2/2005 | Sakurai | H04N 25/59 348/E3.018 |
| 7,319,242 | B2* | 1/2008 | Shimizu | G02B 3/0056 257/98 |
| 7,446,294 | B2* | 11/2008 | Lin | H01L 27/14627 250/214 R |
| 7,821,559 | B2* | 10/2010 | Kishi | H04N 25/76 348/308 |
| 9,123,839 | B2 | 9/2015 | Cheng et al. | |
| 9,153,612 | B2* | 10/2015 | Miyanami | H01L 27/14641 |
| 9,372,286 | B2* | 6/2016 | Li | B29D 11/00384 |
| 9,570,493 | B2 | 2/2017 | Cheng et al. | |

(Continued)

FOREIGN PATENT DOCUMENTS

| | | |
|---|---|---|
| KR | 2020-0141678 A | 12/2020 |
| KR | 2021-0038832 A | 4/2021 |

*Primary Examiner* — Jarrett J Stark
(74) *Attorney, Agent, or Firm* — Harness, Dickey & Pierce, P.L.C.

(57) ABSTRACT

An image sensor includes a substrate, a pixel isolation pattern in the substrate and defining unit pixel regions in the substrate, color filters on the substrate and corresponding to the unit pixel regions, respectively, a low-refractive index pattern between adjacent color filters of the color filters to at least partially isolate the adjacent color filters from direct contact with each other, an insulating structure between the substrate and the color filters, and a light blocking pattern vertically overlapping with the pixel isolation pattern. The light blocking pattern is within the insulating structure and is isolated from direct contact with the low-refractive index pattern.

18 Claims, 18 Drawing Sheets

(56) References Cited

U.S. PATENT DOCUMENTS

| | | | |
|---|---|---|---|
| 10,276,620 B2 | 4/2019 | Chien et al. | |
| 10,728,475 B2* | 7/2020 | Yanagita | H01L 27/14643 |
| 10,741,599 B2* | 8/2020 | Yanagita | H10F 39/182 |
| 10,784,300 B1 | 9/2020 | Lin | |
| 10,840,280 B2* | 11/2020 | Tomekawa | H10F 39/8027 |
| 2004/0096124 A1* | 5/2004 | Nakamura | H04N 25/778 |
| | | | 348/E3.019 |
| 2005/0078377 A1* | 4/2005 | Li | B29D 11/00365 |
| | | | 359/619 |
| 2005/0110093 A1* | 5/2005 | Altice | H10F 39/803 |
| | | | 348/E3.018 |
| 2008/0211945 A1* | 9/2008 | Hong | H04N 25/585 |
| | | | 348/294 |
| 2008/0266434 A1* | 10/2008 | Sugawa | H04N 25/78 |
| | | | 348/308 |
| 2008/0290382 A1* | 11/2008 | Hirota | H01L 27/14627 |
| | | | 348/294 |
| 2011/0076001 A1* | 3/2011 | Iwasaki | G03B 7/099 |
| | | | 396/114 |
| 2011/0121162 A1* | 5/2011 | Murata | H10F 39/802 |
| | | | 250/214 P |
| 2011/0175981 A1* | 7/2011 | Lai | H10F 39/8053 |
| | | | 348/46 |
| 2011/0215223 A1* | 9/2011 | Unagami | H10F 39/15 |
| | | | 257/E27.159 |
| 2011/0228149 A1* | 9/2011 | Naruse | H01L 27/14641 |
| | | | 348/E5.091 |
| 2012/0086845 A1* | 4/2012 | Enomoto | H01L 27/14614 |
| | | | 438/57 |
| 2012/0217601 A1* | 8/2012 | Miyanami | H10F 39/807 |
| | | | 257/E31.127 |
| 2012/0262616 A1* | 10/2012 | Sa | H04N 25/575 |
| | | | 348/311 |
| 2014/0253767 A1* | 9/2014 | Kato | H04N 25/134 |
| | | | 257/432 |
| 2015/0084144 A1* | 3/2015 | Suzuki | H10F 39/8053 |
| | | | 438/70 |
| 2016/0276396 A1* | 9/2016 | Tayanaka | H10F 39/024 |
| 2016/0307942 A1 | 10/2016 | Cheng et al. | |
| 2017/0099422 A1* | 4/2017 | Goma | H04N 25/745 |
| 2018/0115727 A1* | 4/2018 | Yanagita | H04N 25/778 |
| 2018/0152650 A1* | 5/2018 | Sakakibara | H01L 27/14641 |
| 2018/0184025 A1* | 6/2018 | Yanagita | H10F 39/8037 |
| 2018/0191973 A1* | 7/2018 | Hirota | H04N 25/76 |
| 2018/0241955 A1* | 8/2018 | Sakano | H04N 25/778 |
| 2018/0308883 A1* | 10/2018 | Yanagita | H01L 27/14629 |
| 2018/0366513 A1* | 12/2018 | Yang | H01L 27/14621 |
| 2019/0019820 A1* | 1/2019 | Takizawa | H10F 39/807 |
| 2019/0043900 A1* | 2/2019 | Oka | H10F 39/12 |
| 2019/0096933 A1* | 3/2019 | Kido | H01L 27/1461 |
| 2019/0098232 A1* | 3/2019 | Mori | H01L 27/1464 |
| 2019/0222811 A1* | 7/2019 | Yamaguchi | H01L 27/14647 |
| 2019/0341411 A1* | 11/2019 | Lim | H04N 25/771 |
| 2020/0083268 A1* | 3/2020 | Kim | H10K 39/32 |
| 2020/0154066 A1* | 5/2020 | Johnson | H04N 25/745 |
| 2020/0395392 A1* | 12/2020 | Do | H10F 39/8027 |
| 2020/0404204 A1* | 12/2020 | Kawazu | H04N 25/702 |
| 2021/0120198 A1* | 4/2021 | Kim | H10F 39/024 |
| 2024/0258346 A1* | 8/2024 | Kim | H01L 27/14685 |

* cited by examiner

IMAGE SENSOR

CROSS-REFERENCE TO RELATED APPLICATION

This U.S. non-provisional patent application claims priority under 35 U.S.C. § 119 to Korean Patent Application No. 10-2021-0140408, filed on Oct. 20, 2021, in the Korean Intellectual Property Office, the entire contents of which are hereby incorporated by reference.

BACKGROUND

The present inventive concepts relate to image sensors, and more particularly, to CMOS image sensors.

An image sensor may be a device for converting an optical image into electrical signals. Image sensors may be categorized as any one of charge coupled device (CCD) image sensors and complementary metal-oxide-semiconductor (CMOS) image sensors. 'CIS' is short for the CMOS image sensor. The CIS may include a plurality of unit pixel regions arranged two-dimensionally. Each of the unit pixel regions may include a photodiode. The photodiode may convert incident light into an electrical signal.

SUMMARY

Some example embodiments of the inventive concepts may provide an image sensor with improved optical properties.

In some example embodiments, an image sensor may include: a substrate, a pixel isolation pattern in the substrate and defining unit pixel regions in the substrate, color filters on the substrate and corresponding to the unit pixel regions, respectively a low-refractive index pattern between adjacent color filters of the color filters to at least partially isolate the adjacent color filters from direct contact with each other; an insulating structure between the substrate and the color filters; and a light blocking pattern vertically overlapping with the pixel isolation pattern. The light blocking pattern may be within the insulating structure and may be isolated from direct contact with the low-refractive index pattern.

In some example embodiments, an image sensor may include: a substrate having a first surface and a second surface opposite to each other: a pixel isolation pattern penetrating the substrate and defining a plurality of unit pixel regions in the substrate, the unit pixel regions each including a separate photoelectric conversion region in the substrate: an insulating structure on the first surface of the substrate; color filters on the insulating structure; a low-refractive index pattern on the insulating structure, the low-refractive index pattern at least partially isolating adjacent color filters of the color filters from each other: a light blocking pattern vertically overlapping with the pixel isolation pattern; and an interconnection layer on the second surface of the substrate. A bottom surface of the low-refractive index pattern may be in contact with (e.g., in direct contact with) a top surface of the insulating structure, and the light blocking pattern may be spaced apart from (e.g., isolated from direct contact with) the low-refractive index pattern by the insulating structure.

In some example embodiments, an image sensor may include: a substrate having a first surface and a second surface which are opposite to each other, the substrate including a pixel array region, an optical black region and a pad region; a pixel isolation pattern in the substrate to define unit pixel regions in the pixel array region of the substrate, the unit pixel regions each having a separate photoelectric conversion region, the pixel isolation pattern including a first isolation pattern and a second isolation pattern, the second isolation pattern being between the first isolation pattern and the substrate a device isolation pattern adjacent to the first surface of the substrate, the pixel isolation pattern penetrating the device isolation pattern; a floating diffusion region adjacent to the first surface of the substrate, the floating diffusion region adjacent to a side of the device isolation pattern: a gate electrode on the first surface of the substrate: a gate dielectric layer between the gate electrode and the substrate, a gate spacer on a side surface of the gate electrode: an interconnection layer on the first surface of the substrate: color filters on the second surface of the substrate: a low-refractive index pattern between adjacent color filters of the color filters to at least partially isolate the adjacent color filters from direct contact with each other: an insulating structure between the substrate and the color filters, the insulating structure including a first fixed charge layer, a second fixed charge layer and a planarization layer which are sequentially stacked on the second surface of the substrate and include different materials; a light blocking pattern vertically overlapping with the pixel isolation pattern: a protective layer covering the low-refractive index pattern and the insulating structure; and a micro lens portion on the color filters. The light blocking pattern may be buried within the insulating structure and may be spaced apart from (e.g., isolated from direct contact with) the low-refractive index pattern.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Figure 1:
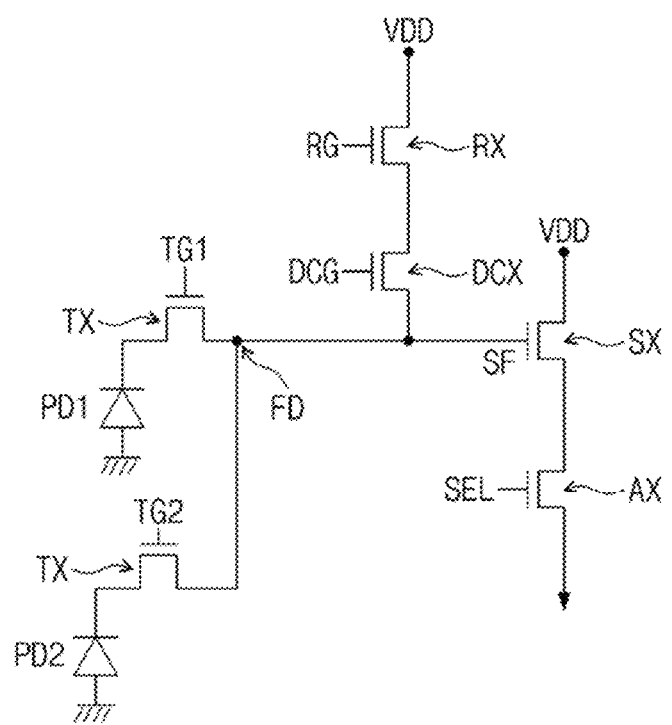
FIG. 1 is a circuit diagram illustrating an image sensor according to some example embodiments of the inventive concepts.

Hereinafter, some example embodiments of the present inventive concepts will be described in detail so that a person skilled in the art would understand the same. The inventive concepts may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present such that the element and the other element are isolated from direct contact with each other by one or more interposing spaces and/or structures. In contrast, when an element is referred to as being "directly on" another element, there are no intervening elements present such that the element and the other element are in direct contact with each other. As described herein, an element that is "on" another element may be above, beneath, and/or horizontally adjacent to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, elements that are described to be in contact with other elements may be understood to be in "direct" contact with the other elements.

FIG. 1 is a circuit diagram illustrating an image sensor according to some example embodiments of the inventive concepts.

Referring to FIG. 1, unit pixel regions of an image sensor may include photoelectric conversion regions PD1 and PD2, transfer transistors TX, a source follower transistor SX, a reset transistor RX, a dual conversion transistor DCX, and a selection transistor AX. The transfer transistors TX, the source follower transistor SX, the reset transistor RX, the dual conversion transistor DCX and the selection transistor AX may include transfer gates TG1 and TG2, a source follower gate SF, a reset gate RG, a dual conversion gate DCG and a selection gate SEL, respectively.

Each of the photoelectric conversion regions PD1 and PD2 may be a photodiode including an n-type dopant region and a p-type dopant region. A floating diffusion region FD may function as a drain of the transfer transistor TX. The floating diffusion region FD may function as a source of the dual conversion transistor DCX. The floating diffusion region FD may be electrically connected to the source follower gate SF of the source follower transistor SX. The source follower transistor SX may be connected to the selection transistor AX.

An operation of the image sensor will be described hereinafter with reference to FIG. 1. First, in a state where light is blocked, a power voltage VDD may be applied to a drain of the reset transistor RX and a drain of the source follower transistor SX, and the reset transistor RX and the dual conversion transistor DCX may be turned-on to discharge charges remaining in the floating diffusion region FD. Thereafter, the reset transistor RX may be turned-off, and external light may be incident to the photoelectric conversion regions PD1 and PD2 to generate electron-hole pairs in each of the photoelectric conversion regions PD1 and PD2. Holes may be moved into and accumulated in the p-type dopant region of each of the photoelectric conversion regions PD1 and PD2, and electrons may be moved into and accumulated in the n-type dopant region thereof. When the transfer transistor TX is turned-on, charges such as the electrons or the holes may be transferred to and accumulated in the floating diffusion region FD. A gate bias of the source follower transistor SX may be changed in proportion to the amount of the accumulated charges, and thus a source potential of the source follower transistor SX may be changed. At this time, the selection transistor AX may be turned-on, and thus a signal by the charges may be read through a column line.

An interconnection line may be electrically connected to at least one of the transfer gates TG1, TG2, the source follower gate SF, the dual conversion gate DCG, the reset gate RG, or the selection gate SEL. The interconnection line may be configured to apply the power voltage VDD to the drain of the reset transistor RX and/or the drain of the source follower transistor SX. The interconnection line may include the column line connected to the selection transistor AX. The interconnection line may include interconnection lines to be described later.

The photoelectric conversion regions PD1 and PD2 electrically share the single floating diffusion region FD in FIG. 1, but embodiments of the inventive concepts are not limited thereto. In some example embodiments, a single unit pixel region may include one of the photoelectric conversion regions PD1 and PD2, the floating diffusion region FD and four transistors TX, RX, AX and SX, and the reset transistor RX, the source follower transistor SX or the selection transistor AX may be shared by neighboring unit pixel regions. In addition, the number of the photoelectric conversion regions PD1 and PD2 electrically sharing the single floating diffusion region FD is not limited thereto. Thus, an integration density of the image sensor may be improved.

Figure 2:
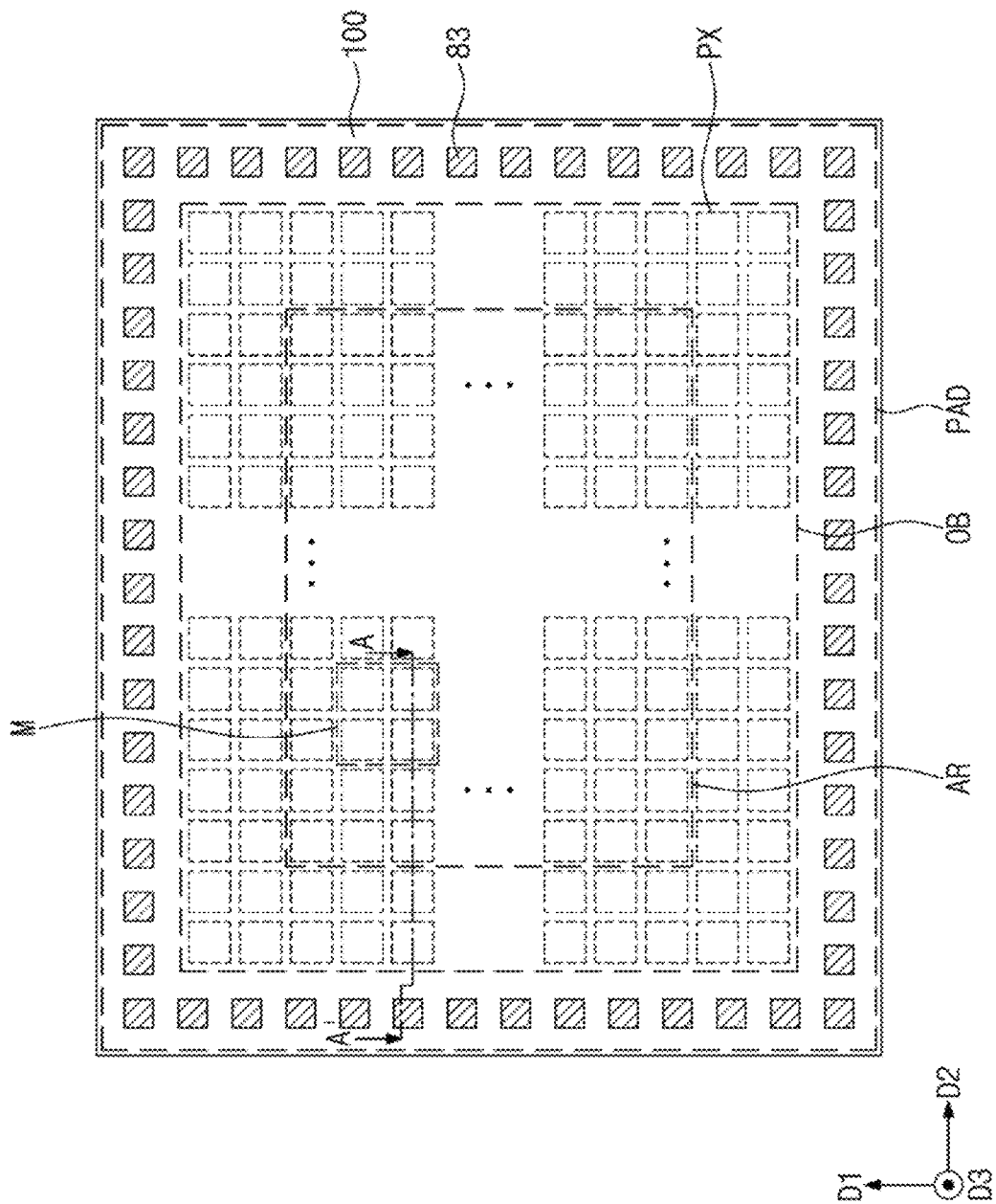
FIG. 2 is a plan view illustrating an image sensor according to some example embodiments of the inventive concepts.
Figure 3:
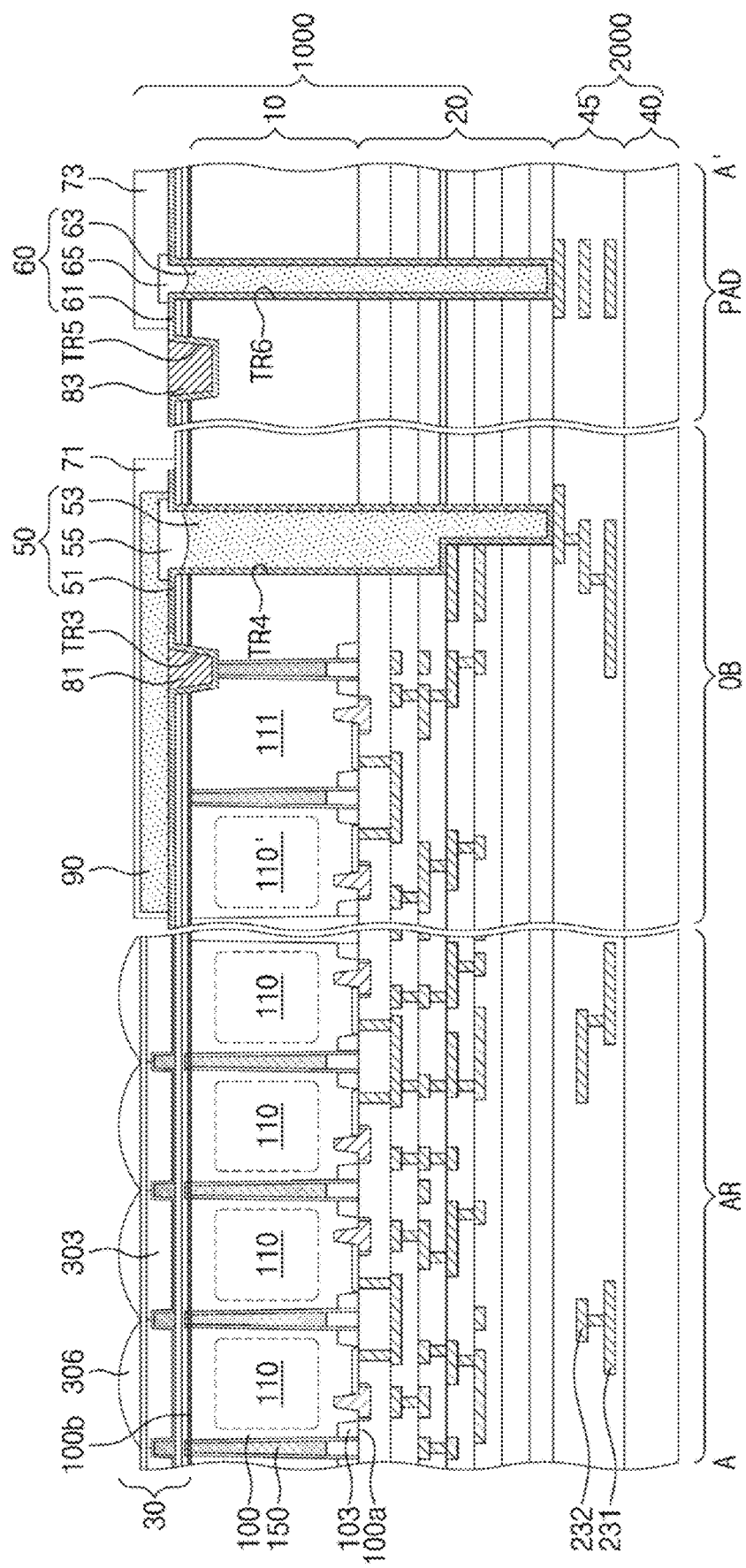
FIG. 3 is a cross-sectional view taken along a line A-A' of FIG. 2 according to some example embodiments of the inventive concepts.

FIG. 2 is a plan view illustrating an image sensor according to some example embodiments of the inventive concepts. FIG. 3 is a cross-sectional view taken along a line A-A' of FIG. 2.

Referring to FIGS. 2 and 3, an image sensor may include a sensor chip 1000 and a logic chip 2000. The sensor chip 1000 may include a photoelectric conversion layer 10, a first interconnection layer 20, and a light transmitting layer 30. The photoelectric conversion layer 10 may include a first substrate 100, a pixel isolation pattern 150, a device isolation pattern 103, and photoelectric conversion regions 110 provided in the first substrate 100. Light incident from the outside may be converted into electrical signals in the photoelectric conversion regions 110.

The first substrate 100 may include a pixel array region AR, an optical black region OB, and a pad region PAD when viewed in a plan view. The pixel array region AR may be disposed in a center portion of the first substrate 100 when viewed in a plan view. The pixel array region AR may include a plurality of unit pixel regions PX. The unit pixel regions PX may output photoelectric signals converted from incident light. The unit pixel regions PX may be two-dimensionally arranged to constitute columns and rows. The columns may be parallel to a first direction D1. The rows may be parallel to a second direction D2. In the present specification, the first direction D1 may be parallel to a first surface 100a of the first substrate 100. The second direction D2 may be parallel to the first surface 100a of the first substrate 100 and may intersect the first direction D1. A third direction D3 may be substantially perpendicular to the first surface 100a of the first substrate 100.

The pad region PAD may be provided in an edge portion of the first substrate 100 and may surround the pixel array region AR, when viewed in a plan view. Second pad terminals 83 may be provided on the pad region PAD. Electrical signals generated from the unit pixel regions PX may be outputted to an external device through the second pad terminals 83. In addition, an external electrical signal or voltage may be transmitted to the unit pixel regions PX through the second pad terminals 83. Since the pad region PAD is disposed in the edge portion of the first substrate 100, the second pad terminals 83 may be easily connected to an external device.

The optical black region OB may be disposed between the pixel array region AR and the pad region PAD of the first substrate 100. The optical black region OB may surround the pixel array region AR when viewed in a plan view. The optical black region OB may include a plurality of dummy regions 111. A signal generated from the dummy region 111 may be used as data for removing a process noise. Hereinafter, the pixel array region AR of the image sensor will be described in more detail with reference to FIGS. 4 and 5.

Figure 4:
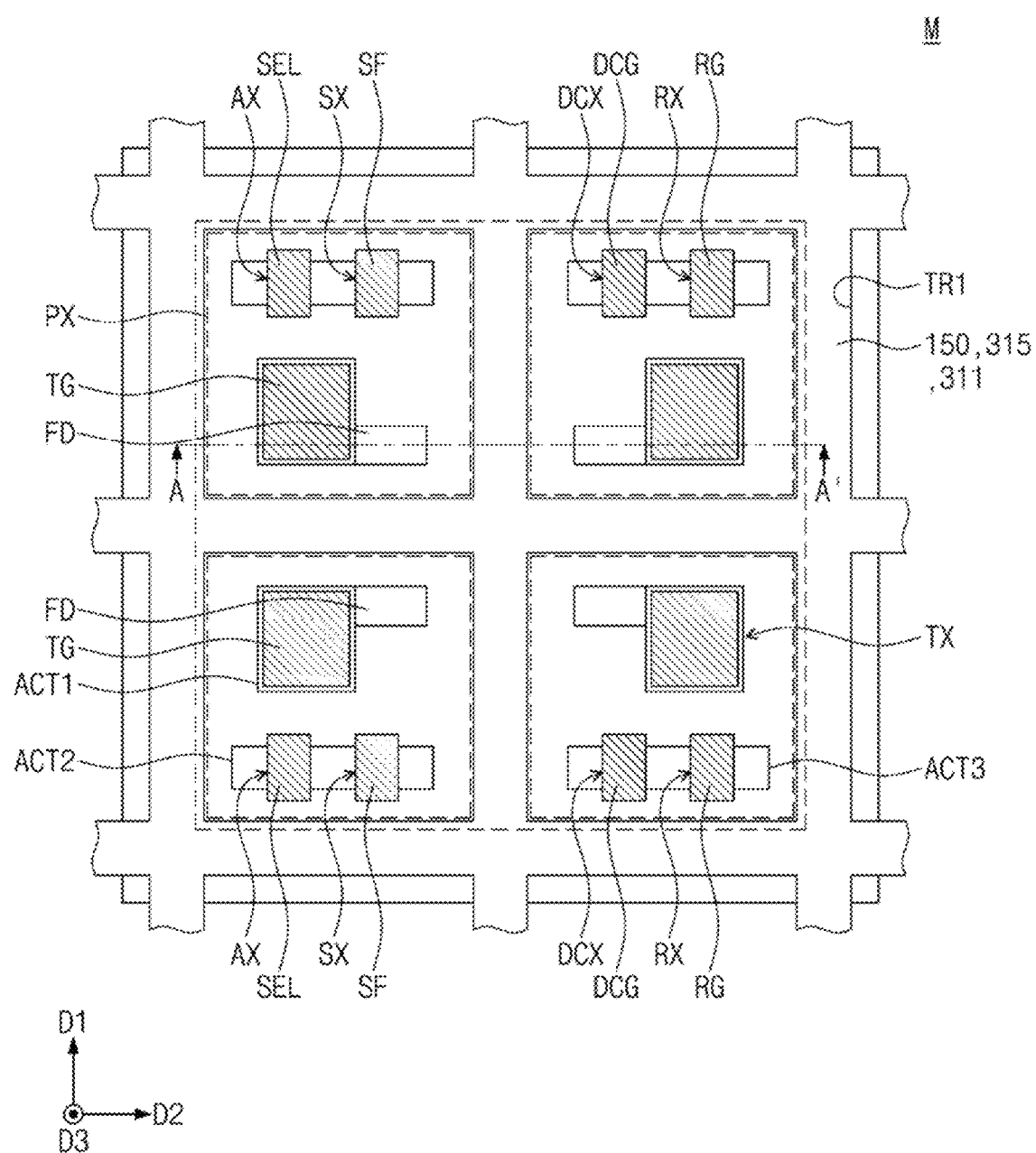
FIG. 4 is an enlarged plan view of a region 'M' of FIG. 2 according to some example embodiments of the inventive concepts.
Figure 5:
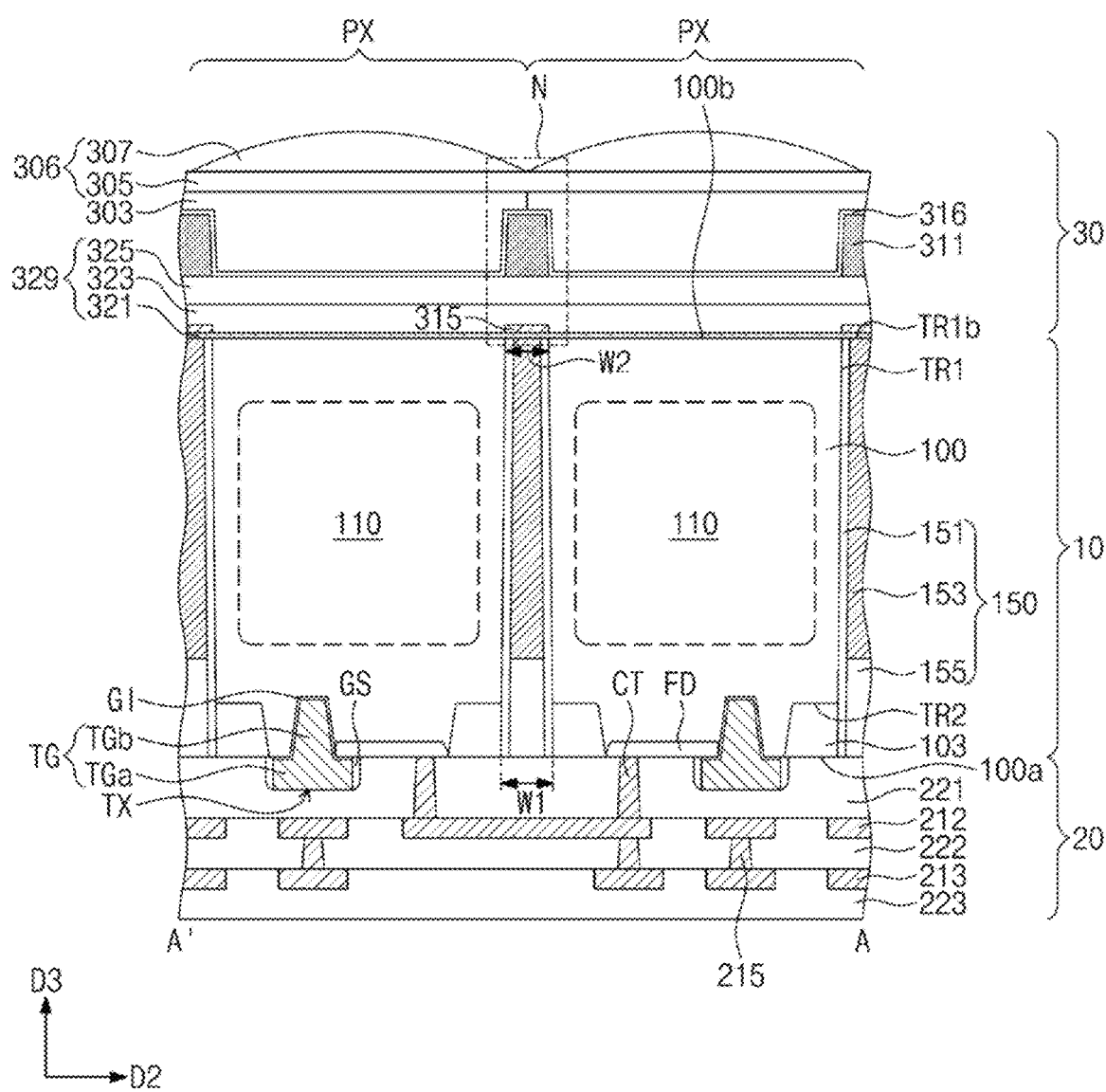
FIG. 5 is a cross-sectional view taken along a line A-A' of FIG. 4 according to some example embodiments of the inventive concepts.
Figure 6:
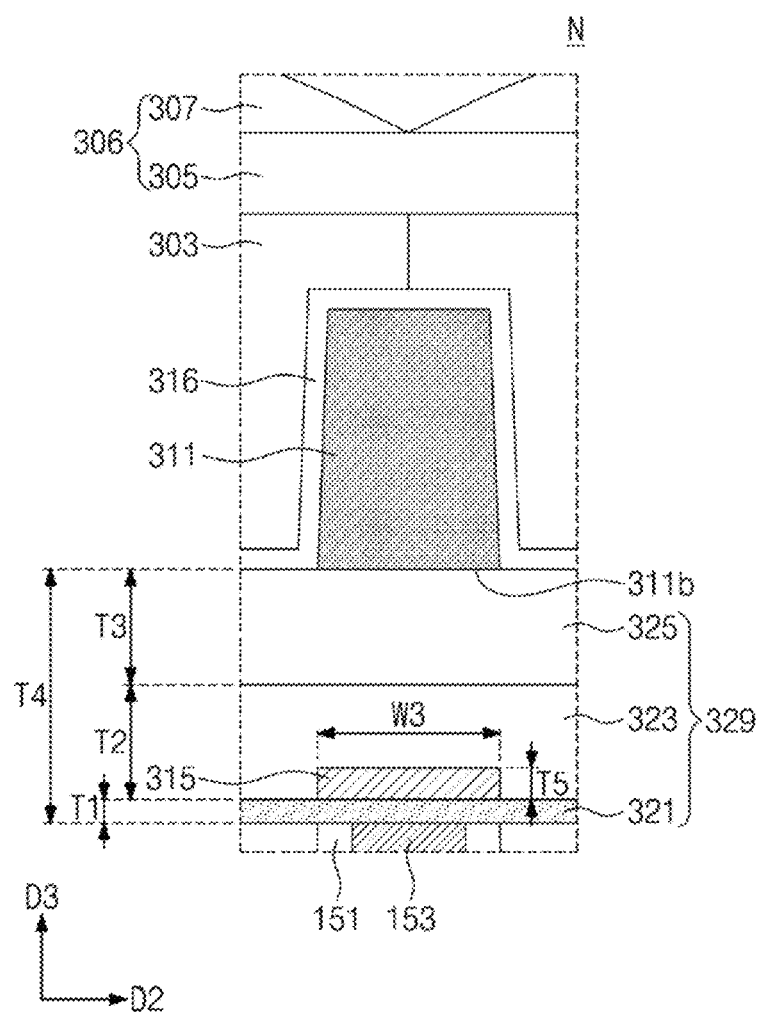
FIG. 6 is an enlarged cross-sectional view of a region 'N' of FIG. 5 according to some example embodiments of the inventive concepts.

FIG. 4 is an enlarged plan view of a region 'M' of FIG. 2. FIG. 5 is a cross-sectional view taken along a line A-A' of FIG. 4. FIG. 6 is an enlarged cross-sectional view of a region 'N' of FIG. 5.

Referring to FIGS. 4 and 5, the image sensor may include the photoelectric conversion layer 10, gates TG, RG, DCG, SEL and SF, the first interconnection layer 20, and the light transmitting layer 30. The photoelectric conversion layer 10 may include the first substrate 100, the pixel isolation pattern 150, and the device isolation pattern 103.

The first substrate 100 may have the first surface 100a and a second surface 100b which are opposite to each other. Light may be incident to the second surface 100b of the first substrate 100. The first interconnection layer 20 may be disposed on the first surface 100a of the first substrate 100, and the light transmitting layer 30 may be disposed on the second surface 100b of the first substrate 100. The first substrate 100 may be a semiconductor substrate or a silicon-on-insulator (SOI) substrate. For example, the semiconductor substrate may include a silicon substrate, a germanium substrate, or a silicon-germanium substrate. The first substrate 100 may include dopants having a first conductivity type. For example, the dopants having the first conductivity type may include p-type dopants such as aluminum (Al), boron (B), indium (In), and/or gallium (Ga).

The first substrate 100 may include the plurality of unit pixel regions PX defined by the pixel isolation pattern 150. The pixel isolation pattern 150 may penetrate the first substrate 100 and may define the plurality of unit pixel regions PX in the first substrate 100, the unit pixel regions PX each including a separate photoelectric conversion region 110 in the first substrate 100. The plurality of unit pixel regions PX may be arranged in a matrix form in the first direction D1 and the second direction D2 which intersect each other. The first substrate 100 may include the photoelectric conversion regions 110. The photoelectric conversion regions 110 may be provided in the first substrate 100 and may be provided in the unit pixel regions PX, respectively. The photoelectric conversion regions 110 may perform the same function as the photoelectric conversion regions PD1 and PD2 of FIG. 1. The photoelectric conversion regions 110 may be regions of the first substrate 100, which are doped with dopants having a second conductivity type. The second conductivity type may be opposite to the first conductivity type. The dopants having the second conductivity type may include n-type dopants such as phosphorus, arsenic, bismuth, and/or antimony. In some example embodiments, each of the photoelectric conversion regions 110 may include a first region adjacent to the first surface 100a and a second region adjacent to the second surface 100b. A dopant concentration of the first region of the photoelectric conversion region 110 may be different from a dopant concentration of the second region of the photoelectric conversion region 110. Thus, the photoelectric conversion region 110 may have a potential gradient between the first surface 100a and the second surface 100b of the first substrate 100. In some example embodiments, the photoelectric conversion region 110 may not have a potential gradient between the first surface 100a and the second surface 100b of the first substrate 100.

The first substrate 100 and the photoelectric conversion region 110 may constitute a photodiode. In other words, the photodiode may be formed by a p-n junction between the first substrate 100 having the first conductivity type and the photoelectric conversion region 110 having the second conductivity type. The photoelectric conversion region 110 forming the photodiode may generate and accumulate photocharges in proportion to an intensity of incident light.

Referring to FIG. 4, the pixel isolation pattern 150 may be provided in the first substrate 100 and may define the unit pixel regions PX. For example, the pixel isolation pattern 150 may be provided between the unit pixel regions PX of the first substrate 100. The pixel isolation pattern 150 may have a grid structure when viewed in a plan view. The pixel isolation pattern 150 may completely surround each of the unit pixel regions PX when viewed in a plan view. The pixel isolation pattern 150 may be provided in a first trench TR1. The first trench TR1 may be recessed from the first surface 100a of the first substrate 100. The pixel isolation pattern 150 may extend from the first surface 100a of the first substrate 100 toward the second surface 100b of the first substrate 100. The pixel isolation pattern 150 may be a deep trench isolation (DTI) layer. The pixel isolation pattern 150 may be provided to penetrate the first substrate 100. A vertical height of the pixel isolation pattern 150 may be substantially equal to a vertical thickness of the first substrate 100. For example, a width of the pixel isolation pattern 150 may become progressively less from the first surface 100a of the first substrate 100 toward the second surface 100b of the first substrate 100. A width of the pixel isolation pattern 150 at the first surface 100a may be a first width W1, and a width of the pixel isolation pattern 150 at the second surface 100b may be a second width W2. In other words, the first width W1 may be greater than the second width W2.

The pixel isolation pattern 150 may include a first isolation pattern 151, a second isolation pattern 153, and a capping pattern 155. The first isolation pattern 151 may be provided along a side surface of the first trench TR1. For example, the first isolation pattern 151 may include a silicon-based insulating material (e.g., silicon nitride, silicon oxide, and/or silicon oxynitride) and/or a high-k dielectric material (e.g., hafnium oxide and/or aluminum oxide). In some example embodiments, the first isolation pattern 151 may include a plurality of layers, and the layers may include different materials. The first isolation pattern 151 may have a refractive index lower than that of the first substrate 100. Thus, a crosstalk phenomenon between the unit pixel regions PX of the first substrate 100 may be reduced or prevented.

The second isolation pattern 153 may be provided in a space surrounded by the first isolation pattern 151. For example, a side surface of the second isolation pattern 153 may be surrounded by the first isolation pattern 151. The first isolation pattern 151 may be disposed between the second isolation pattern 153 and the first substrate 100. The second isolation pattern 153 may be spaced apart from (e.g., isolated from direct contact with) the first substrate 100 by the first isolation pattern 151. Thus, when the image sensor operates, the second isolation pattern 153 may be electrically isolated from the first substrate 100. The second isolation pattern 153 may include a crystalline semiconductor material (e.g., poly-silicon). For example, the second isolation pattern 153 may further include dopants, and the dopants may include dopants having the first conductivity type or dopants having the second conductivity type. For example, the second isolation pattern 153 may include doped poly-silicon. In some example embodiments, the second isolation pattern 153 may include an undoped crystalline semiconductor material. For example, the second isolation pattern 153 may include undoped poly-silicon. In the present specification, the term 'undoped' may mean that an intentional doping process is not performed. The dopants may include n-type dopants or p-type dopants.

The capping pattern 155 may be provided on a bottom surface of the second isolation pattern 153. The capping pattern 155 may be disposed adjacent to the first surface 100a of the first substrate 100. A bottom surface of the capping pattern 155 may be coplanar with the first surface 100a of the first substrate 100. A top surface of the capping pattern 155 may be substantially the same as the bottom surface of the second isolation pattern 153. The capping pattern 155 may include a non-conductive material. For example, the capping pattern 155 may include a silicon-based insulating material (e.g., silicon nitride, silicon oxide, and/or silicon oxynitride) and/or a high-k dielectric material (e.g., hafnium oxide and/or aluminum oxide). Thus, the pixel isolation pattern 150 may prevent photocharges, generated by light incident to each of the unit pixel regions PX, from being moved into adjacent unit pixel regions PX by random drift. In other words, the pixel isolation pattern 150 may prevent a crosstalk phenomenon between the unit pixel regions PX.

The device isolation pattern 103 may be provided in the first substrate 100. For example, the device isolation pattern 103 may be provided in a second trench TR2. The second trench TR2 may be recessed from the first surface 100a of the first substrate 100. The device isolation pattern 103 may be a shallow trench isolation (STI) layer. The device isolation pattern 103 may define first active patterns ACT1, second active patterns ACT2, and third active patterns ACT3 (see FIG. 4). A top surface of the device isolation pattern 103 may be provided in the first substrate 100. A width of the device isolation pattern 103 may become progressively less from the first surface 100a of the first substrate 100 toward the second surface 100b of the first substrate 100. The top surface of the device isolation pattern 103 may be vertically spaced apart from (e.g., isolated from direct contact with) the photoelectric conversion regions 110. The pixel isolation pattern 150 may overlap with a portion of the device isolation pattern 103. The pixel isolation pattern 150 may penetrate the device isolation pattern 103. At least a portion of the device isolation pattern 103 may be disposed on a lower side surface of the pixel isolation pattern 150 and may be in contact with (e.g., in direct contact with) the lower side surface of the pixel isolation pattern 150. A side surface and a top surface of the device isolation pattern 103 and a side surface of the pixel isolation pattern 150 may form a stepped structure. A depth of the device isolation pattern 103 may be less than a depth of the pixel isolation pattern 150. The device isolation pattern 103 may include a silicon-based insulating material. For example, the device isolation pattern 103 may include silicon nitride, silicon oxide, and/or silicon oxynitride. In some example embodiments, the device isolation pattern 103 may include a plurality of layers, and the layers may include different materials.

Each of the unit pixel regions PX may include the first active pattern ACT1 defined by the device isolation pattern 103. The first active pattern ACT1 may have a L-shape in a plan view. Each of at least some of the unit pixel regions PX may include the second active pattern ACT2. The second active pattern ACT2 may have a line shape extending in the second direction D2. Each of at least others of the unit pixel regions PX may include the third active pattern ACT3. The third active pattern ACT3 may be defined by the device isolation pattern 103. The third active pattern ACT3 may have a line shape extending in the second direction D2. However, the planar shapes of the first to third active patterns ACT1, ACT2 and ACT3 are not limited to the shapes illustrated in FIG. 4 and may be variously modified.

The transfer transistor TX, the source follower transistor SX, the reset transistor RX, the dual conversion transistor DCX and the selection transistor AX described above with reference to FIG. 1 may be provided on the first surface 100a of the first substrate 100. The transfer transistor TX may be provided on the first active pattern ACT1 of each of the unit pixel regions PX. The transfer transistor TX may be electrically connected to the photoelectric conversion region 110. The transfer transistor TX may include a transfer gate TG on the first active pattern ACT1 and a floating diffusion region FD in the first active pattern ACT1. The transfer gate TG may include a first portion TGa provided on the first surface 100a of the first substrate 100 and a second portion TGb extending from the first portion TGa into the first substrate 100. A maximum width of the first portion TGa in the second direction D2 may be greater than a maximum width of the second portion TGb in the second direction D2. The floating diffusion region FD may be adjacent to a side of the transfer gate TG. The floating diffusion region FD may be located in the first active pattern ACT1. The floating diffusion region FD may have the second conductivity type (e.g., an n-type) opposite to the first conductivity type of the first substrate 100.

The source follower transistor SX and the selection transistor AX may be provided on the second active pattern ACT2 of the unit pixel region PX. The source follower transistor SX may include a source follower gate SF on the second active pattern ACT2, and the selection transistor AX may include a selection gate SEL on the second active pattern ACT2. The reset transistor RX and the dual conversion transistor DCX may be provided on the third active pattern ACT3 of the unit pixel region PX. The reset transistor RX may include a reset gate RG on the third active pattern ACT3, and the dual conversion transistor DCX may include a dual conversion gate DCG on the third active pattern ACT3. A gate dielectric layer GI may be disposed between the first substrate 100 and each of the transfer gate TG, the selection gate SEL, the source follower gate SF, the dual conversion gate DCG and the reset gate RG. A gate spacer GS may be provided on a side surface of each of the gates TG, SEL, SF, DCG and RG. For example, the gate spacer GS may include silicon nitride, silicon carbonitride, and/or silicon oxynitride.

The first interconnection layer 20 may include insulating layers 221, 222 and 223, interconnection lines 212 and 213, vias 215, and contacts CT. The insulating layers 221, 222 and 223 may include a first insulating layer 221, a second insulating layer 222, and a third insulating layer 223. The first insulating layer 221 may cover the first surface 100a of the first substrate 100. The first insulating layer 221 may cover the gates TG, SEL, SF, RG and DCG. The second insulating layer 222 may be provided on the first insulating layer 221. The third insulating layer 223 may be provided on the second insulating layer 222. The first to third insulating layers 221, 222 and 223 may include a non-conductive material. For example, the first to third insulating layers 221, 222 and 223 may include a silicon-based insulating material such as silicon oxide, silicon nitride, and/or silicon oxynitride.

The interconnection lines 212 and 213 may be provided on the first insulating layer 221. Some of the interconnection lines 212 and 213 may be vertically connected to the floating diffusion regions FD through some of the contacts CT. Even though not shown in the drawings, others of the interconnection lines 212 and 213 may be vertically connected to the transfer transistors TX, the source follower transistors SX, the reset transistors RX, the dual conversion transistors DCX and the selection transistors AX through others of the contacts CT. The contacts CT may penetrate the first insulating layer 221. Electrical signals converted in the photoelectric conversion regions 110 may be signal-processed in the first interconnection layer 20. The interconnection lines 212 and 213 may be arranged regardless of arrangement of the photoelectric conversion regions 110 and may be variously changed unlike the drawings. The interconnection lines 212 and 213 may include first interconnection lines 212 and second interconnection lines 213. The first interconnection lines 212 may be provided in the second insulating layer 222. The second interconnection lines 213 may be provided in the third insulating layer 223. The vias 215 may be provided in the second insulating layer 222. The vias 215 may electrically connect the first and second interconnection lines 212 and 213. The first and second interconnection lines 212 and 213, the vias 215 and the contacts CT may include a metal material. For example, the first and second interconnection lines 212 and 213, the vias 215 and the contacts CT may include copper (Cu).

The light transmitting layer 30 may include an insulating structure 329, color filters 303, and a micro lens portion 306. The light transmitting layer 30 may concentrate and filter incident light and may provide the concentrated and filtered light to the photoelectric conversion layer 10.

The color filters 303 may be provided on the second surface 100*b* of the first substrate 100. The color filters 303 may be disposed on the unit pixel regions PX, respectively. The color filters 303 may include primary color filters. The color filters 303 may include first to third color filters having different colors. For some examples, the first to third color filters may include green, red, and blue color filters, respectively. The first to third color filters may be arranged in a Bayer pattern type. For other examples, the first to third color filters may have other colors such as cyan, magenta, and yellow.

The insulating structure 329 may be disposed between the second surface 100*b* of the first substrate 100 and the color filters 303. The insulating structure 329 may prevent reflection of light, such that light incident to the second surface 100*b* of the first substrate 100 smoothly reaches the photoelectric conversion regions 110. The insulating structure 329 may be referred to as an anti-reflection structure.

The insulating structure 329 may include a first fixed charge layer 321, a second fixed charge layer 323 and a planarization layer 325, which are sequentially stacked on the second surface 100*b* of the first substrate 100. The first fixed charge layer 321, the second fixed charge layer 323 and the planarization layer 325 may include different materials. The first fixed charge layer 321 may include one of aluminum oxide, tantalum oxide, titanium oxide, and hafnium oxide. The second fixed charge layer 323 may include another of aluminum oxide, tantalum oxide, titanium oxide, and hafnium oxide. For example, the first fixed charge layer 321 may include aluminum oxide, the second fixed charge layer 323 may include hafnium oxide, and the planarization layer 325 may include silicon oxide. Even though not shown in the drawings, in some example embodiments, a silicon-based anti-reflection layer (not shown) may be disposed between the second fixed charge layer 323 and the planarization layer 325. The silicon-based anti-reflection layer may include silicon nitride.

The micro lens portion 306 may be provided on the color filters 303. The micro lens portion 306 may include a flat portion 305 being in contact with (e.g., in direct contact with) the color filters 303, and micro lenses 307 provided on the flat portion 305 and disposed on the unit pixel regions PX, respectively. For some examples, the flat portion 305 may include an organic material. For other examples, the flat portion 305 may include silicon oxide or silicon oxynitride. The micro lenses 307 may have convex shapes to concentrate light incident to the unit pixel regions PX. Each of the micro lenses 307 may vertically overlap with the photoelectric conversion region 110.

The light transmitting layer 30 may further include a low-refractive index pattern 311, a protective layer 316, and a light blocking pattern 315. The light blocking pattern 315 may be buried in the insulating structure 329. The light blocking pattern 315 may vertically overlap with the pixel isolation pattern 150. In other words, the light blocking pattern 315 may have a grid structure. The light blocking pattern 315 may be disposed on a top surface of the first fixed charge layer 321. The light blocking pattern 315 may be spaced apart from (e.g., isolated from direct contact with) the pixel isolation pattern 150 by the first fixed charge layer 321. For example, the light blocking pattern 315 may include at least one of a metal (e.g., titanium, tantalum, or tungsten) or a metal nitride (e.g., titanium nitride). The light blocking pattern 315 may be disposed between the first fixed charge layer 321 and the second fixed charge layer 323. The light blocking pattern 315 may perform a function of shielding static electricity generated from the outside.

The low-refractive index pattern 311 may be disposed between the color filters 303 adjacent to each other to separate the adjacent color filters 303 from each other. For example, as shown in at least FIGS. 5 and 6, the low-refractive index pattern 311 may be located between adjacent color filters 303 to at least partially isolate the adjacent color filters 303 from direct contact with each other. The low-refractive index pattern 311 may be disposed on the insulating structure 329. For example, a width of the low-refractive index pattern 311 may gradually decrease as a level in the third direction D3 increases. The low-refractive index pattern 311 may have a grid structure. The low-refractive index pattern 311 may be spaced apart from (e.g., isolated from direct contact with) the light blocking pattern 315 by the insulating structure 329.

The low-refractive index pattern 311 may be formed of a material having a refractive index lower than that of the color filters 303. The low-refractive index pattern 311 may be formed of an organic material. For example, the low-refractive index pattern 311 may be a polymer layer including silica nanoparticles. Since the low-refractive index pattern 311 has the low refractive index, the amount of light incident to the photoelectric conversion region 110 may be increased, and crosstalk between the unit pixel regions PX may be reduced. In other words, light receiving efficiency of the photoelectric conversion regions 110 may be increased, and signal-to-noise ratio (SNR) characteristics of the photoelectric conversion regions 110 may be improved.

The protective layer 316 may cover a surface of the low-refractive index pattern 311 and may have a substantially uniform thickness. The protective layer 316 may further extend onto a bottom surface of each of the color filters 303. For example, the protective layer 316 may include a single layer or multi-layer including at least one of an aluminum oxide layer or a silicon carboxide layer. The protective layer 316 may protect the color filters 303 and may perform a function of absorbing moisture.

Typically, the light blocking pattern 315 may be provided on a bottom surface of the low-refractive index pattern 311. In this case, the amount of incident light absorbed by the light blocking pattern 315 may be relatively increased. Thus, sensitivity of an image sensor may be reduced, and SNR characteristics may be deteriorated.

According to some example embodiments of the inventive concepts, the light blocking pattern 315 may be buried in the insulating structure 329 (e.g., located within a volume space that is defined by outermost surfaces of the insulating structure 329 and/or isolated from direct exposure to an exterior of the insulating structure 329, such that the light blocking pattern 315 is understood to be within the insulating structure 329) and thus may be spaced apart from (e.g., isolated from direct contact with) the low-refractive index pattern 311. Thus, the amount of incident light absorbed by the light blocking pattern 315 may be relatively reduced. In addition, the light blocking pattern 315 may vertically overlap with the pixel isolation pattern 150 and may be closer to the pixel isolation pattern 150. Thus, the light blocking pattern 315 may perform a function of shielding the pixel isolation pattern 150 to reduce the amount of incident light absorbed by poly-silicon of the pixel isolation pattern 150. Therefore, the sensitivity of the image sensor may be improved, and the SNR characteristics may be improved. As a result, optical properties of the image sensor may be improved.

Referring again to FIG. 3, the image sensor according to some example embodiments of the inventive concepts may further include the logic chip 2000. The logic chip 2000 may be stacked on the sensor chip 1000. The logic chip 2000 may include a second substrate 40 and a second interconnection layer 45. The second interconnection layer 45 may be disposed between the first interconnection layer 20 and the second substrate 40.

The pixel array region AR may include the plurality of unit pixel regions PX. The pixel array region AR may be the same as described above with reference to FIGS. 2 to 5.

A first connection structure 50, a first pad terminal 81, and a bulk color filter 90 may be provided on the first substrate 100 of the optical black region OB. The first connection structure 50 may include a first light blocking pattern 51, a first insulating pattern 53, and a first capping pattern 55. The first light blocking pattern 51 may be provided on the second surface 100b of the first substrate 100. The first light blocking pattern 51 may conformally cover inner surfaces of a third trench TR3 and a fourth trench TR4. The first light blocking pattern 51 may penetrate the photoelectric conversion layer 10, the first interconnection layer 20 and the second interconnection layer 45 to electrically connect the photoelectric conversion layer 10 and the first interconnection layer 20 to each other. More particularly, the first light blocking pattern 51 may be connected to the interconnection lines in the first interconnection layer 20 and the pixel isolation pattern 150 in the photoelectric conversion layer 10. Thus, the first connection structure 50 may be electrically connected to the interconnection lines in the first interconnection layer 20. The first light blocking pattern 51 may include a metal material, for example, tungsten. The first light blocking pattern 51 may block light incident to the optical black region OB.

The first pad terminal 81 may be provided in the third trench TR3 to fill a remaining portion of the third trench TR3. The first pad terminal 81 may include a metal material, for example, aluminum. The first pad terminal 81 may be connected to the pixel isolation pattern 150 (in particular, the second isolation pattern 153). Thus, a negative voltage may be applied to the pixel isolation pattern 150 through the first pad terminal 81.

The first insulating pattern 53 may be provided on the first light blocking pattern 51 and may fill a remaining portion of the fourth trench TR4. The first insulating pattern 53 may penetrate the photoelectric conversion layer 10 and the first interconnection layer 20. The first capping pattern 55 may be provided on the first insulating pattern 53. The first capping pattern 55 may include the same material as the capping pattern 155 of FIG. 5.

The bulk color filter 90 may be provided on the first pad terminal 81, the first light blocking pattern 51, and the first capping pattern 55. The bulk color filter 90 may cover the first pad terminal 81, the first light blocking pattern 51, and the first capping pattern 55. A first protective layer 71 may be provided on the bulk color filter 90 to cover the bulk color filter 90.

A photoelectric conversion region 110' and the dummy region 111 may be provided in the optical black region OB of the first substrate 100. For example, the photoelectric conversion region 110' may be doped with dopants having the second conductivity type different from the first conductivity type. The second conductivity type may be, for example, an n-type. The photoelectric conversion region 110' may have a similar structure to that of the photoelectric conversion region 110 described with reference to FIG. 5 but may not perform an operation of receiving light to generate an electrical signal. The dummy region 111 may be a region not doped with dopants. Signals generated from the photoelectric conversion region 110' and the dummy region 111 may be used as data for removing a process noise.

In the pad region PAD, a second connection structure 60, the second pad terminal 83 and a second protective layer 73 may be provided on the first substrate 100. The second connection structure 60 may include a second light blocking pattern 61, a second insulating pattern 63, and a second capping pattern 65.

The second light blocking pattern 61 may be provided on the second surface 100b of the first substrate 100. More particularly, the second light blocking pattern 61 may conformally cover inner surfaces of a fifth trench TR5 and a sixth trench TR6. The second light blocking pattern 61 may penetrate the photoelectric conversion layer 10, the first interconnection layer 20, and a portion of the second interconnection layer 45. More particularly, the second light blocking pattern 61 may be in contact with (e.g., in direct contact with) interconnection lines 231 and 232 in the second interconnection layer 45. The second light blocking pattern 61 may include a metal material, for example, tungsten.

The second pad terminal 83 may be provided in the fifth trench TR5. The second pad terminal 83 may be provided on the second light blocking pattern 61 to fill a remaining portion of the fifth trench TR5. The second pad terminal 83 may include a metal material, for example, aluminum. The second pad terminal 83 may function as an electrical connection path between the image sensor and an external device. The second insulating pattern 63 may fill a remaining portion of the sixth trench TR6. The second insulating pattern 63 may completely or partially penetrate the photoelectric conversion layer 10 and the first interconnection layer 20. The second capping pattern 65 may be provided on the second insulating pattern 63. The second capping pattern 65 may include the same material as the capping pattern 155 of FIG. 5. The second protective layer 73 may cover a portion of the second light blocking pattern 61 and the second capping pattern 65.

A current applied through the second pad terminal 83 may flow to the pixel isolation pattern 150 through the second light blocking pattern 61, the interconnection lines 231 and 232 in the second interconnection layer 45, and the first light blocking pattern 51. Electrical signals generated from the photoelectric conversion regions 110 and 110' and the dummy region 111 may be transmitted to the outside through the interconnection lines of the first interconnection layer 20, the interconnection lines 231 and 232 in the second interconnection layer 45, the second light blocking pattern 61, and the second pad terminal 83.

Hereinafter, the insulating structure 329 will be described in more detail with reference to FIG. 6. The light blocking pattern 315 may be spaced apart from (e.g., isolated from direct contact with) the low-refractive index pattern 311 by the insulating structure 329. Thus, a bottom surface 311b of the low-refractive index pattern 311 may be in contact with (e.g., in direct contact with) a top surface of the insulating structure 329. The light blocking pattern 315 may be buried in the insulating structure 329. Since the light blocking pattern 315 is buried in the insulating structure 329, the amount of light absorbed by the light blocking pattern 315 may be reduced.

A thickness of the first fixed charge layer 321 may be a first thickness T1. A thickness of the second fixed charge layer 323 may be a second thickness T2. A thickness of the planarization layer 325 may be a third thickness T3. The first thickness T1 may be less than each of the second thickness T2 and the third thickness T3. For example, the first thickness T1 may range from 5 nm to 30 nm. The second thickness T2 and the third thickness T3 may be substantially equal to each other. Alternatively, the second thickness T2 and the third thickness T3 may be different from each other. For example, the second thickness T2 may range from 40 nm to 120 nm, and the third thickness T3 may range from 45 nm to 200 nm. In some example embodiments, the second thickness T2 may be less than the third thickness T1.

A thickness of the insulating structure 329 may be a fourth thickness T4. The fourth thickness T4 may be substantially equal to a sum of the first to third thicknesses T1, T2 and T3. A thickness of the light blocking pattern 315 may be a fifth thickness T5. For example, the fifth thickness T5 may range from 5 nm to 10 nm. A ratio of the fifth thickness T5 to the fourth thickness T4 may range from 1/70 to 1/5.

A width of the light blocking pattern 315 may be a third width W3. The third width W3 may be substantially equal to the second width W2 corresponding to the minimum width of the pixel isolation pattern 150. For example, a ratio of the third width W3 to the second width W2 may range from 0.85 to 1.15. Since the third width W3 is substantially equal to the second width W2, it is possible to effectively prevent incident light from being absorbed by the poly-silicon of the pixel isolation pattern 150.

FIGS. 7A, 7B, 7C, 7D, 7E, and 7F are cross-sectional views taken along the line A-A' of FIG. 4 to illustrate a method of manufacturing an image sensor according to some example embodiments of the inventive concepts.

Figure 7A:
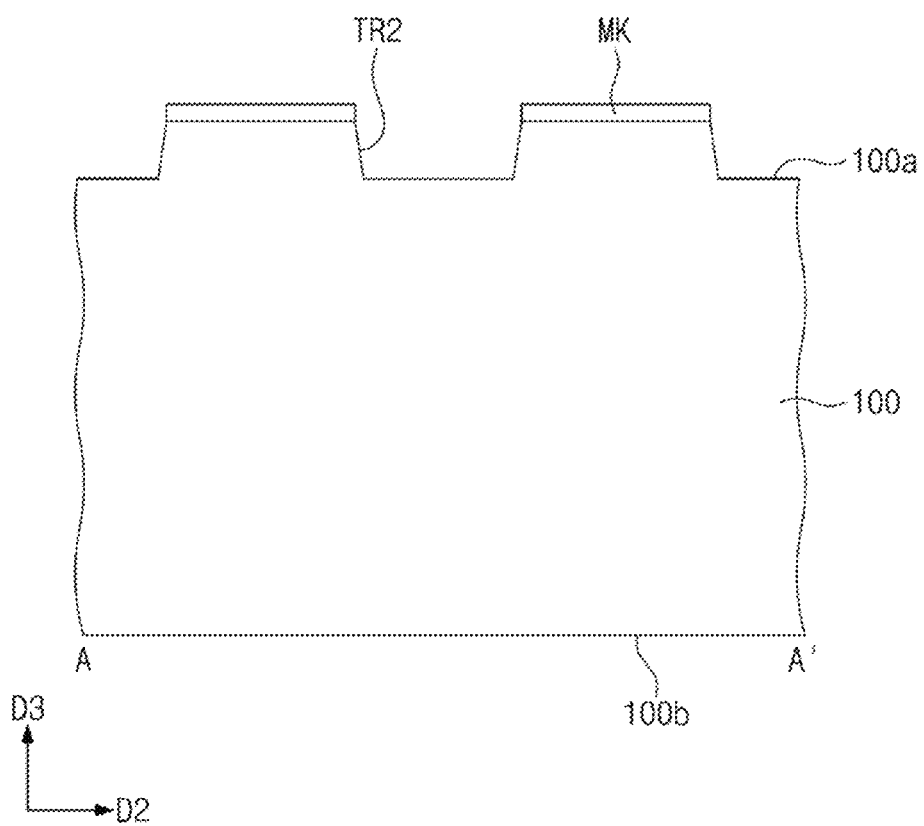
FIGS. 7A, 7B, 7C, 7D, 7E, and 7F are cross-sectional views taken along the line A-A' of FIG. 4 to illustrate a method of manufacturing an image sensor according to some example embodiments of the inventive concepts.

Referring to FIGS. 4 and 7A, a first substrate 100 having first and second surfaces 100a and 100b opposite to each other may be prepared. The first substrate 100 may include dopants having a first conductivity type (e.g., a p-type). For some examples, the first substrate 100 may be a substrate in which an epitaxial layer having the first conductivity type is formed on a bulk silicon substrate having the first conductivity type. For other examples, the first substrate 100 may be a bulk substrate including a well having the first conductivity type.

A second trench TR2 may be formed on the first surface 100a of the first substrate 100. The formation of the second trench TR2 may include forming a mask pattern MK on the first surface 100a of the first substrate 100, and performing an etching process on the first surface 100a by using the mask pattern MK as an etch mask.

Figure 7B:
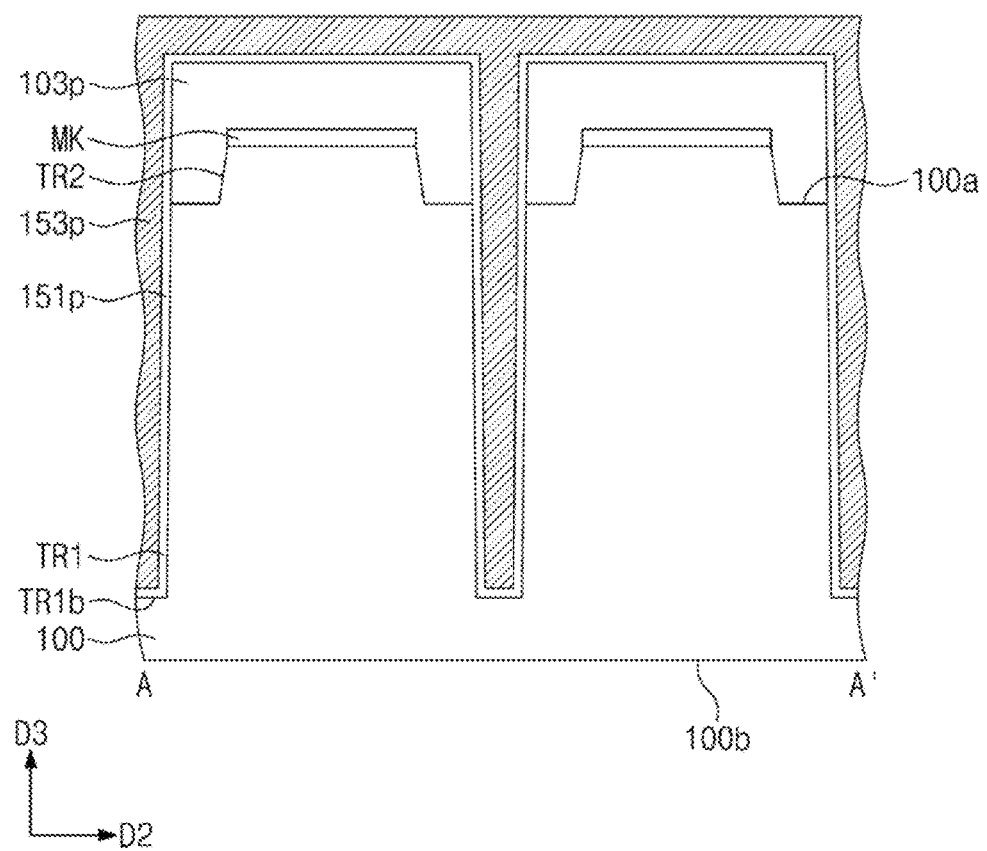

Referring to FIGS. 4 and 7B, a first trench TR1 may be formed from the first surface 100a of the first substrate 100. Before the formation of the first trench TR1, a preliminary device isolation pattern 103p may be formed on the first surface 100a of the first substrate 100. The preliminary device isolation pattern 103p may be formed by performing a deposition process on the first surface 100a of the first substrate 100. The preliminary device isolation pattern 103p may completely fill the second trench TR2 and may cover the mask pattern MK. A top surface of the preliminary device isolation pattern 103p may be formed at a higher level than the first surface 100a of the first substrate 100. A mask (not shown) may be formed on the preliminary device isolation pattern 103p, and the preliminary device isolation pattern 103p and the first substrate 100 may be anisotropically etched to form the first trench TR1. A bottom surface TR1b of the first trench TR1 may be located at a higher level than the second surface 100b of the first substrate 100. The preliminary device isolation pattern 103p may include, for example, silicon oxide, silicon nitride, and/or silicon oxynitride.

After the formation of the first trench TR1, a first preliminary isolation pattern 151p may be formed to conformally cover an inner surface of the first trench TR1. The first preliminary isolation pattern 151p may cover the inner surface of the first trench TR1 and a top surface of the preliminary device isolation pattern 103p. The first preliminary isolation pattern 151p may be formed by depositing an insulating material on the first substrate 100 having the first trench TR1. The first preliminary isolation pattern 151p may include, for example, silicon oxide, silicon nitride, and/or silicon oxynitride.

A second preliminary isolation pattern 153p may be formed on the first preliminary isolation pattern 151p. The second preliminary isolation pattern 153p may be formed by performing a deposition process on the first substrate 100 having the first preliminary isolation pattern 151p. The second preliminary isolation pattern 153p may cover the first preliminary isolation pattern 151p on the inner surface of the first trench TR1 and may cover the top surface of the preliminary device isolation pattern 103p. The second preliminary isolation pattern 153p may include, for example, poly-silicon.

Figure 7C:
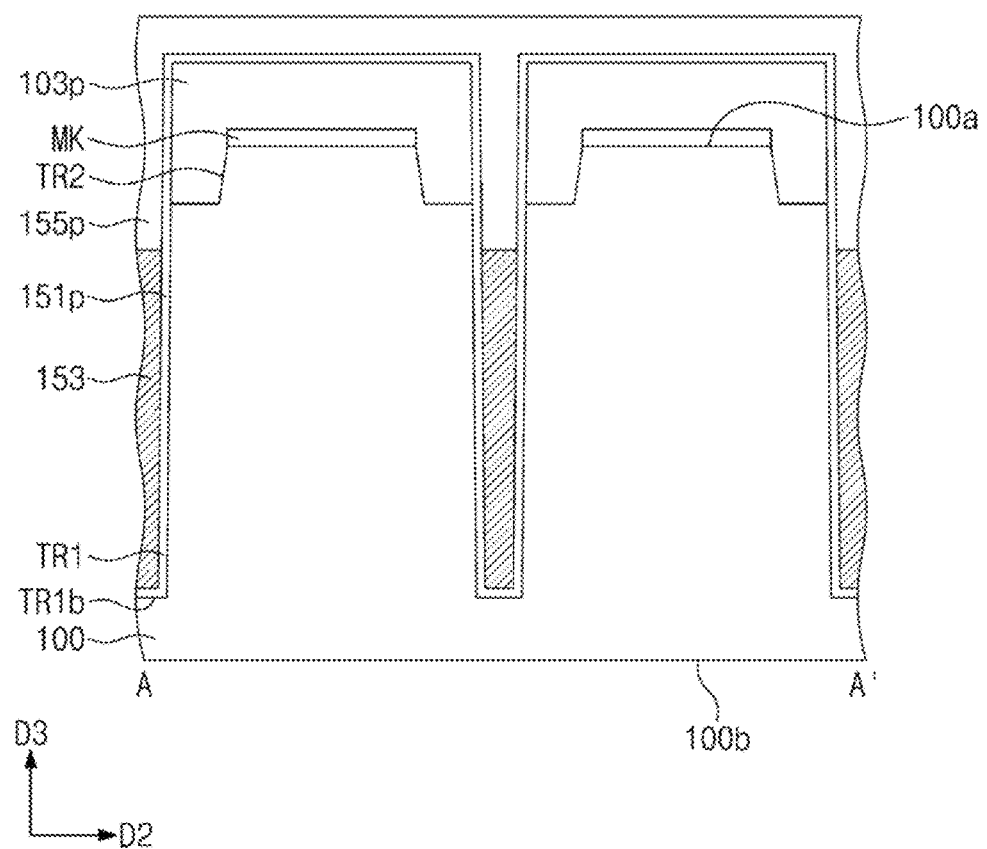

Referring to FIGS. 4 and 7C, a first etching process may be performed to remove an upper portion of the second preliminary isolation pattern 153p, and thus a second isolation pattern 153 may be formed. Therefore, a portion of the first preliminary isolation pattern 151p may be exposed to the outside. The first etching process may be performed until the second isolation pattern 153 is located at a lower level than a bottom surface of the preliminary device isolation pattern 103p.

According to some example embodiments, after the first etching process, a doping process may be performed on the second isolation pattern 153. For example, the doping process may be a beam line ion implantation process or a plasma doping process (PLAD). In the plasma doping process, a source material may be supplied in a gaseous state into a process chamber. The source material may be ionized to form plasma, and then, a bias of a high voltage may be applied to an electrostatic chuck (not shown) on which the first substrate 100 is loaded, thereby injecting the ionized source material into the second isolation pattern 153. The plasma doping process may realize uniform doping at a relatively very deep position and may improve a doping process speed. Meanwhile, the beam line ion implantation process may be difficult to uniformly dope the second isolation pattern 153 along a vertical depth because the first trench TR1 is relatively deep and narrow. Thus, when the doping process is performed by the beam line ion implantation process, a dopant concentration of the second isolation pattern 153 may be changed depending on a vertical depth. In the image sensor, when a negative voltage is applied to the second isolation pattern 153, a dark current of the image sensor may be reduced.

A preliminary capping pattern 155p may be formed to cover an entire top surface of the first substrate 100 and to fill an upper portion of the first trench TR1. The formation of the preliminary capping pattern 155p may include performing a deposition process on the first surface 100a of the first substrate 100. The preliminary capping pattern 155p may include silicon oxide, silicon nitride, and/or silicon oxynitride.

Figure 7D:
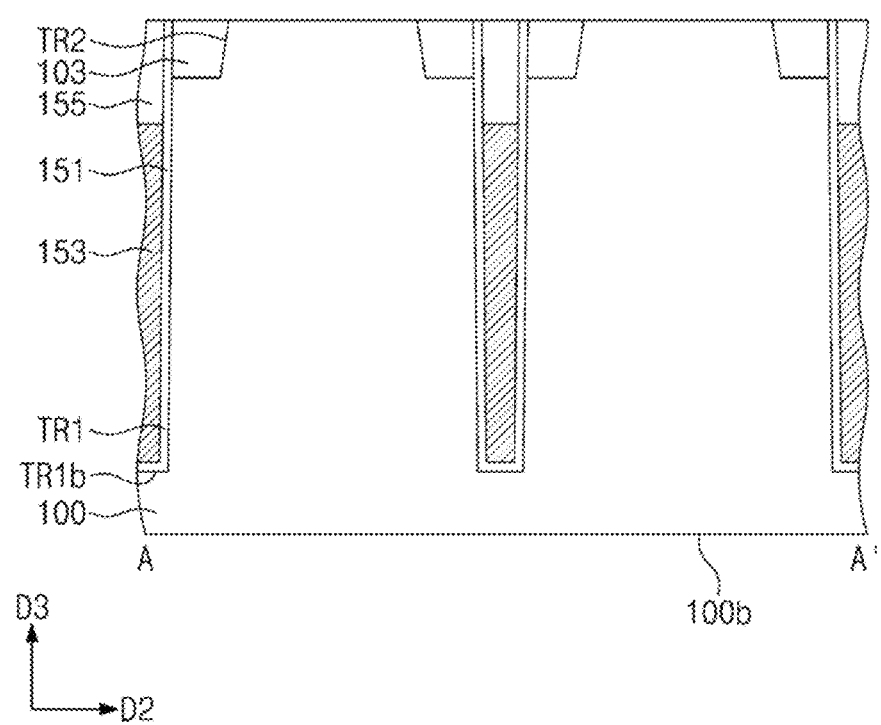

Referring to FIGS. 4 and 7D, a capping pattern 155, a first isolation pattern 151 and a device isolation pattern 103 may be formed. The formation of the capping pattern 155, the first isolation pattern 151 and the device isolation pattern 103 may include performing a planarization process on the first surface 100a of the first substrate 100. In some example embodiments, the mask pattern MK may be removed after the planarization process, and thus damage of the first surface 100a of the first substrate 100 may be prevented.

Figure 7E:
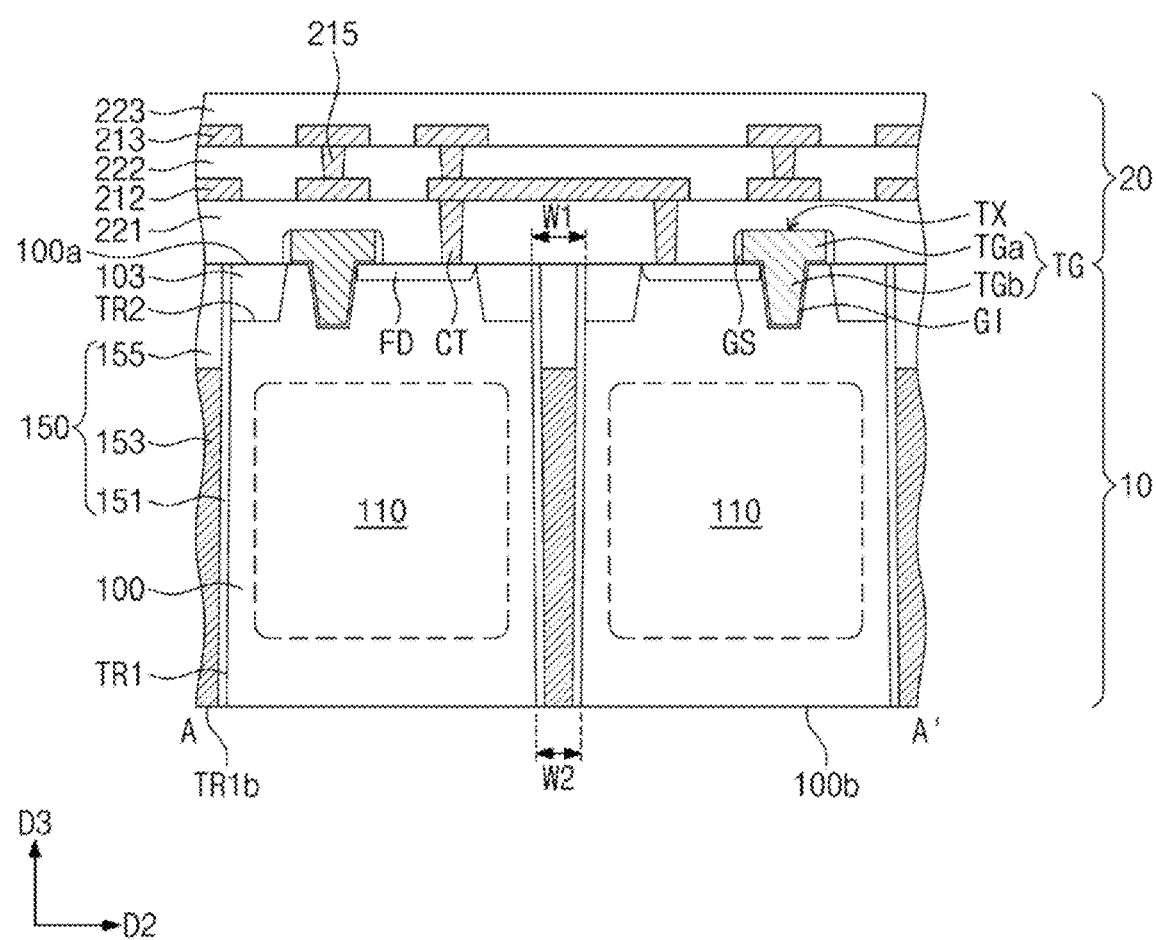

Referring to FIGS. 4 and 7E, dopants may be doped in the first substrate 100 to form photoelectric conversion regions 110. The photoelectric conversion regions 110 may have a second conductivity type (e.g., an n-type) different from the first conductivity type (e.g., a p-type). A thinning process of removing a portion of the first substrate 100 may be performed to reduce a vertical thickness of the first substrate 100. The thinning process may include grinding or polishing and anisotropically or isotropically etching the second surface 100b of the first substrate 100. To thin the first substrate 100, the first substrate 100 may be inverted. A portion of the first substrate 100 may be removed by the grinding or polishing process, and then, the anisotropic or isotropic etching process may be performed to remove remaining surface defects of the first substrate 100.

Since the thinning process is performed on the second surface 100b of the first substrate 100, bottom surfaces of the first isolation pattern 151 and the second isolation pattern 153 may be exposed. The bottom surfaces of the first isolation pattern 151 and the second isolation pattern 153 may be located at substantially the same level as the second surface 100b of the first substrate 100.

Next, a transfer transistor TX may be formed on a first active pattern ACT1 of each of the unit pixel regions PX, a source follower transistor SX and a selection transistor AX may be formed on a second active pattern ACT2, and a reset transistor RX and a dual conversion transistor DCX may be formed on a third active pattern ACT3.

More particularly, the formation of the transfer transistor TX may include forming a floating diffusion region FD by doping the first active pattern ACT1 with dopants, and forming a transfer gate TG on the first active pattern ACT1. The formation of the source follower transistor SX and the selection transistor AX may include forming dopant regions by doping the second active pattern ACT2 with dopants, and forming a source follower gate SF and a selection gate SEL on the second active pattern ACT2. The formation of the reset transistor RX and the dual conversion transistor DCX may include forming dopant regions by doping the third active pattern ACT3 with dopants, and forming a reset gate RG and a dual conversion gate DCG on the third active pattern ACT3.

A first insulating layer 221 may be formed on the first surface 100a of the first substrate 100. The first insulating layer 221 may be formed to cover the transfer transistor TX, the source follower transistor SX, the reset transistor RX, the dual conversion transistor DCX and the selection transistor AX, which are formed on the first surface 100a of the first substrate 100. Contacts CT may be formed in the first insulating layer 221. A second insulating layer 222 may be formed on the first insulating layer 221, and a third insulating layer 223 may be formed on the second insulating layer 222. First interconnection lines 212 may be formed in the second insulating layer 222. Second interconnection lines 213 may be formed in the third insulating layer 223. Vias 215 connecting the first and second interconnection lines 212 and 213 may be formed in the second insulating layer 222.

Figure 7F:
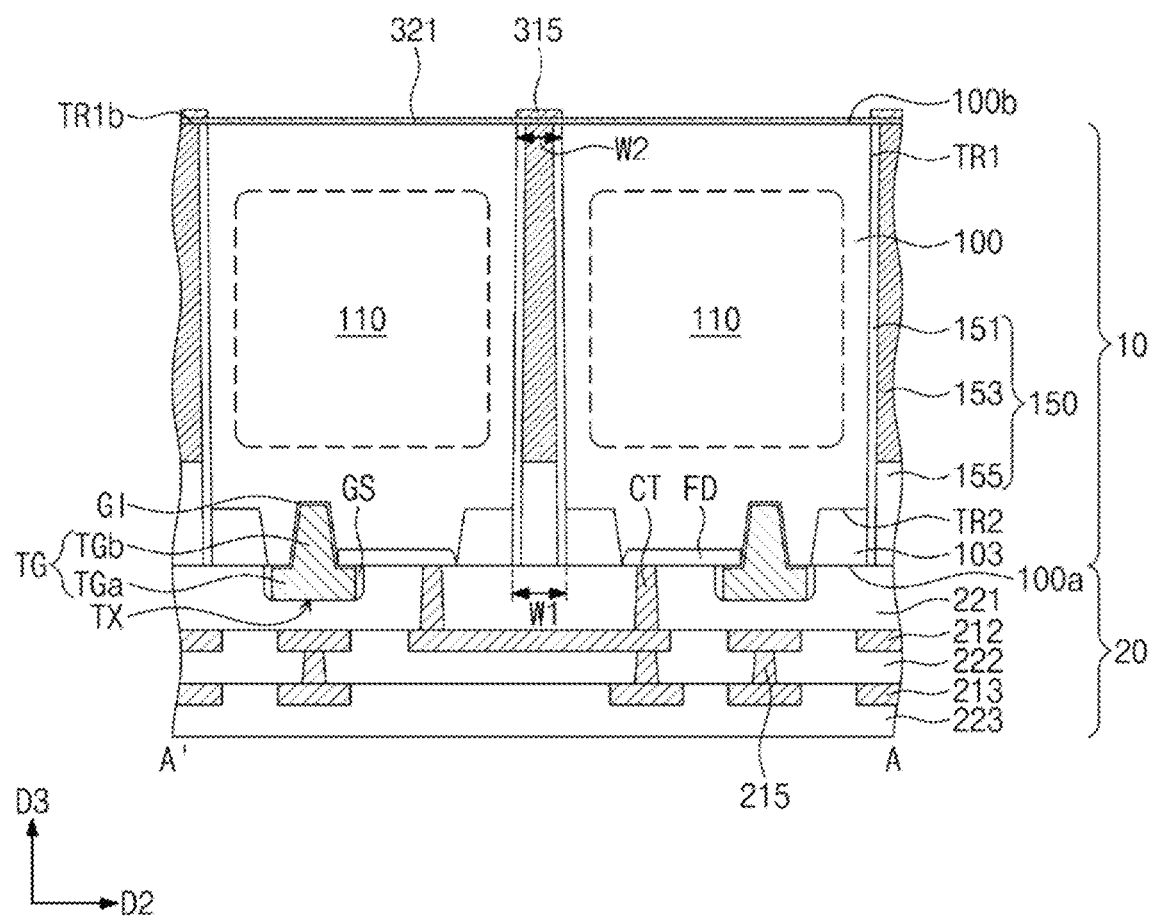

Referring to FIGS. 4 and 7F, the first substrate 100 may be flipped, and a first fixed charge layer 321 may be formed on the second surface 100b of the first substrate 100. The first fixed charge layer 321 may cover the second surface 100b of the first substrate 100. For example, the first fixed charge layer 321 may include aluminum oxide.

A light blocking pattern 315 may be formed on the first fixed charge layer 321. The light blocking pattern 315 may vertically overlap with the pixel isolation pattern 150. In other words, the light blocking pattern 315 may have a grid structure. For example, the light blocking pattern 315 may include titanium nitride (TiN). The light blocking pattern 315 may be spaced apart from (e.g., isolated from direct contact with) the pixel isolation pattern 150 by the first fixed charge layer 321.

Referring again to FIGS. 4 to 6, a second fixed charge layer 323 and a planarization layer 325 may be sequentially formed on the first fixed charge layer 321. The second fixed charge layer 323 may cover the light blocking pattern 315. The first fixed charge layer 321, the second fixed charge layer 323 and the planarization layer 325 may constitute an insulating structure 329. The light blocking pattern 315 may be buried in the insulating structure 329.

A low-refractive index pattern 311 may be formed on the insulating structure 329. A protective layer 316 may be formed to cover the low-refractive index pattern 311. Color filters 303 may be formed in spaces surrounded by the low-refractive index pattern 311. A micro lens portion 306 may be formed on the color filters 303.

Figure 8A:
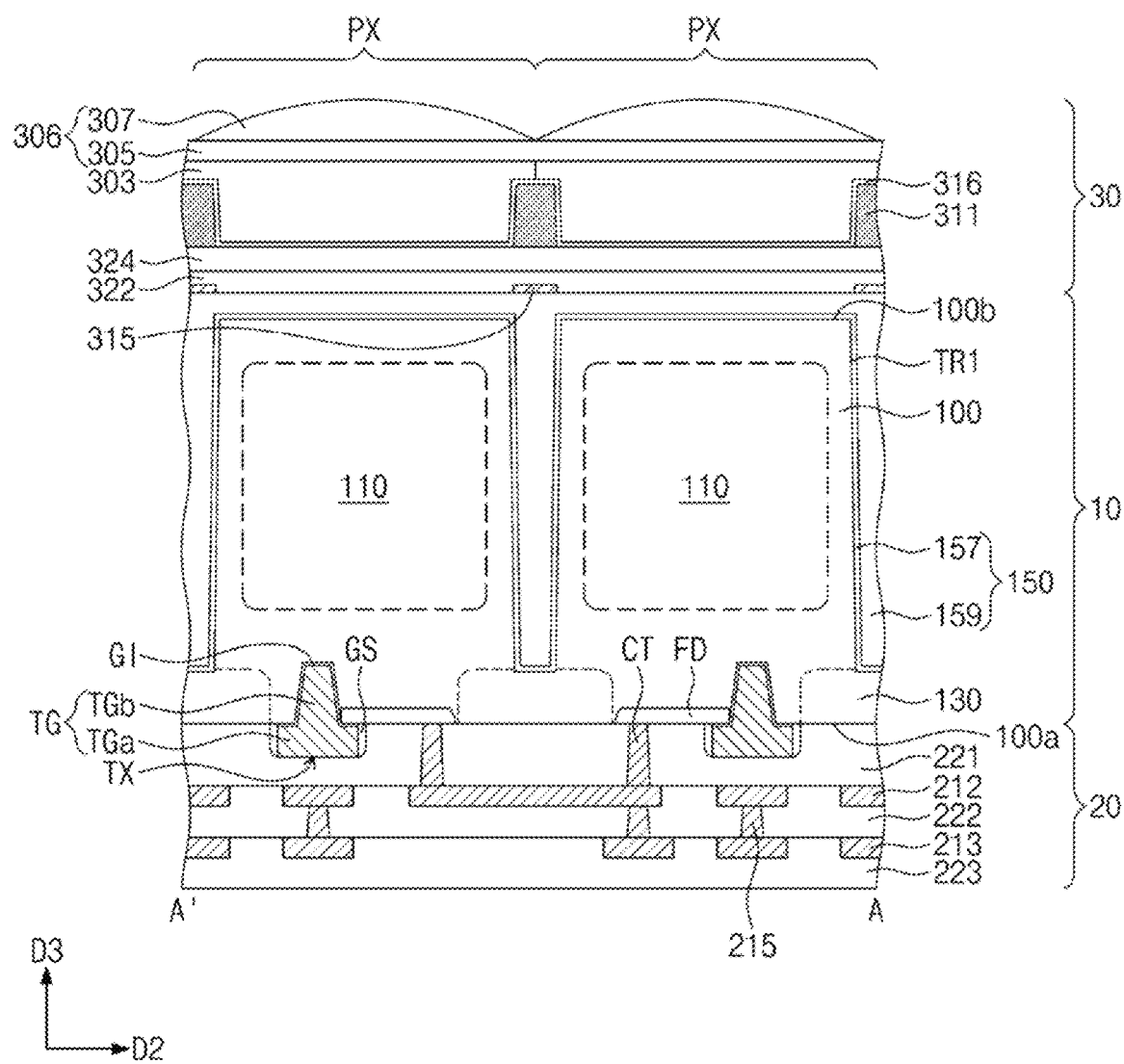
FIGS. 8A, 8B, and 8C are cross-sectional views taken along the line A-A' of FIG. 4 to illustrate image sensors according to some example embodiments of the inventive concepts.
Figure 8B:
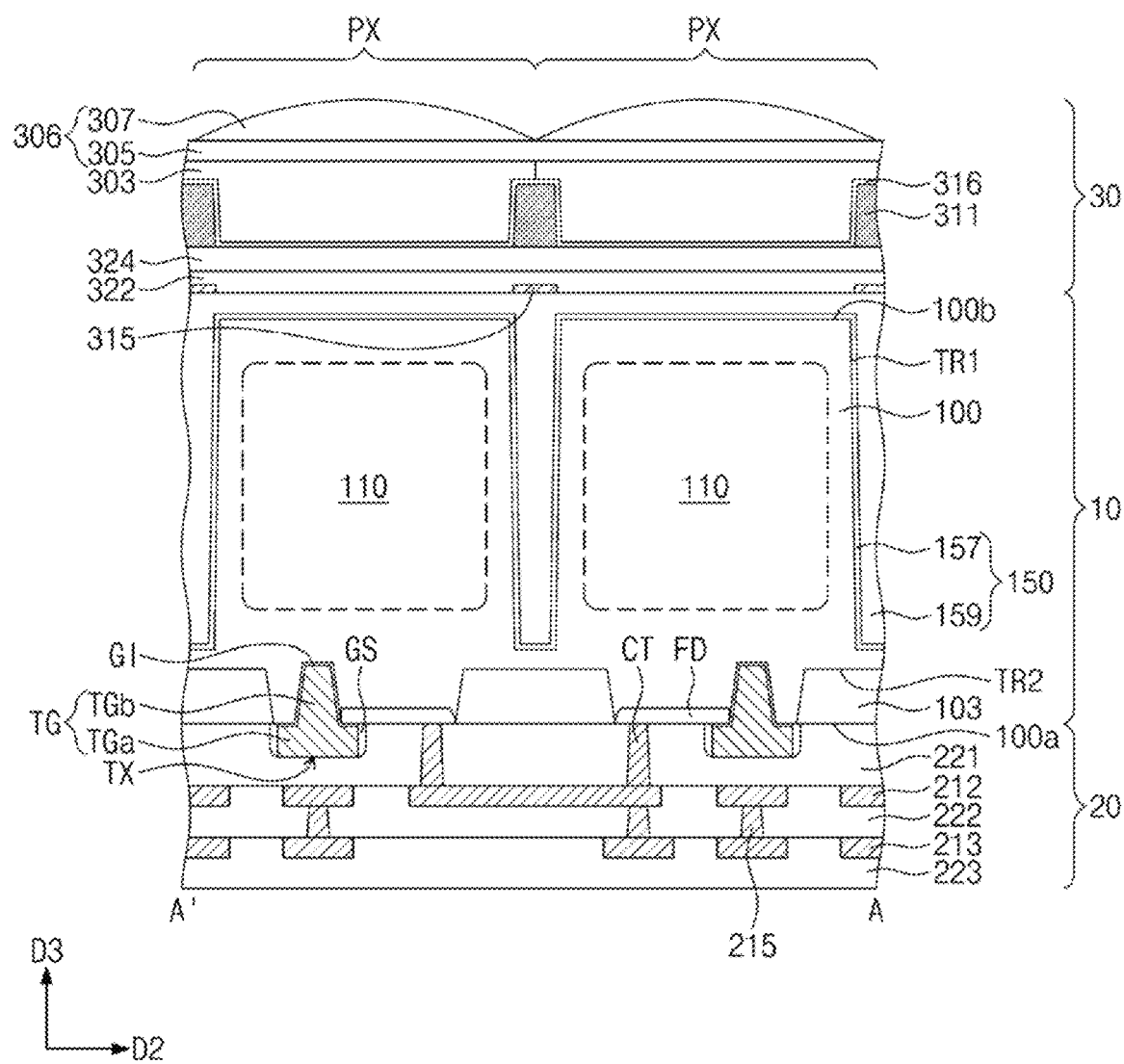
Figure 8C:
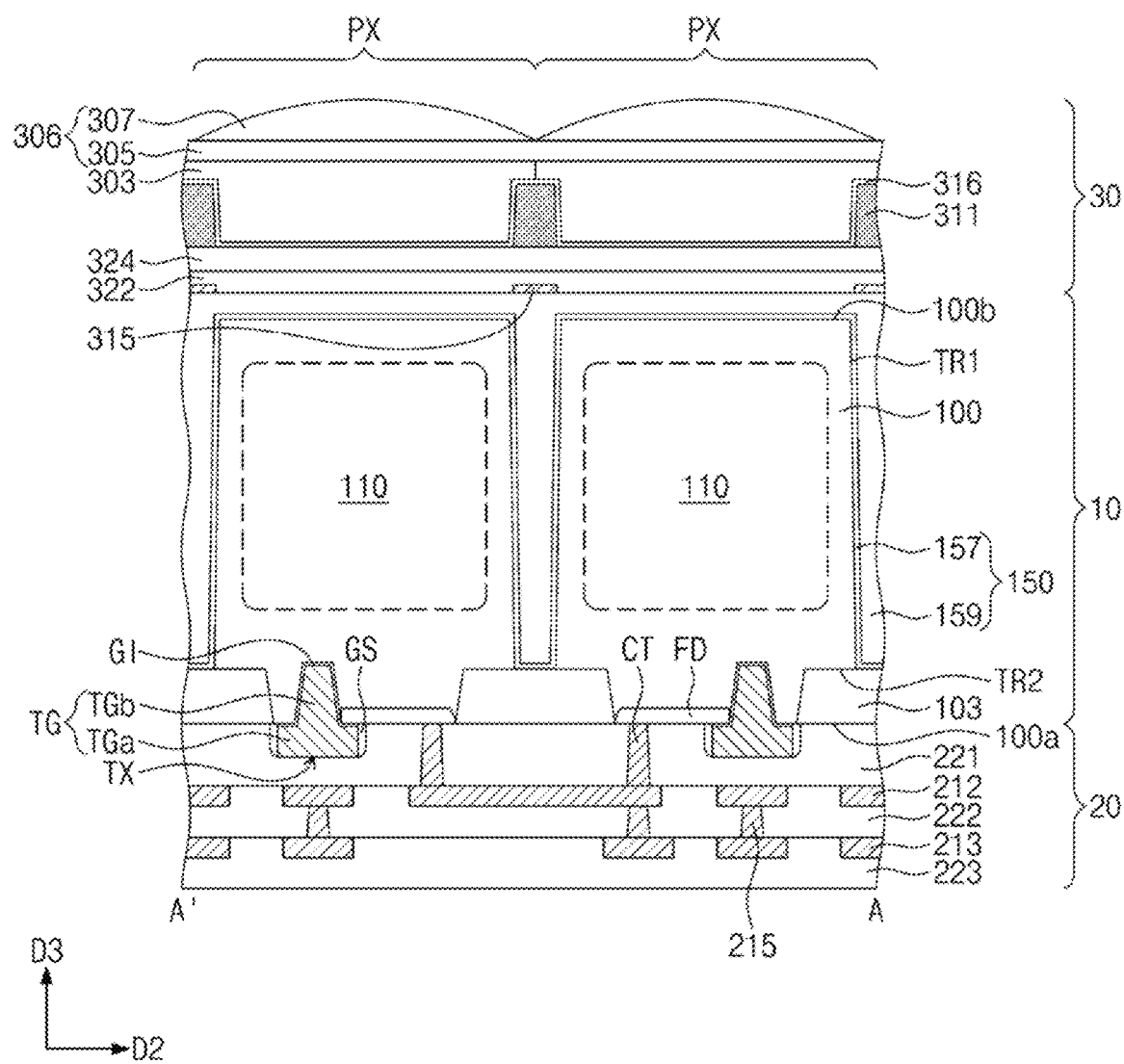

FIGS. 8A, 8B, and 8C are cross-sectional views taken along the line A-A' of FIG. 4 to illustrate image sensors according to some example embodiments of the inventive concepts. In the present embodiments, the descriptions to the same features as mentioned with reference to FIGS. 4 to 6 will be omitted and differences between the present embodiments and some example embodiments of FIGS. 4 to 6 will be mainly described, for the purpose of ease and convenience in explanation.

Referring to FIGS. 4 and 8A, a pixel isolation pattern 150 may be provided in a first trench TR1. The first trench TR1 may be recessed from the second surface 100b of the first substrate 100. A width of the first trench TR1 may become progressively less from the second surface 100b of the first substrate 100 toward the first surface 100a of the first substrate 100.

The pixel isolation pattern 150 may include a fixed charge layer 157 conformally provided along an inner surface of the first trench TR1, and a filling insulation pattern 159 provided on the fixed charge layer 157. The fixed charge layer 157 may have negative fixed charges. The fixed charge layer 157 may be formed of a metal oxide or metal fluoride including at least one metal selected from a group including hafnium (Hf), zirconium (Zr), aluminum (Al), tantalum (Ta), titanium (Ti), yttrium (Y) and a lanthanoid. For example, the fixed charge layer 157 may be a hafnium oxide layer or an aluminum oxide layer. Hole accumulation may occur around the fixed charge layer 157. Thus, a dark current and a white spot may be effectively reduced. The filling insulation pattern 159 may include an insulating material having an excellent step coverage property. For example, the filling insulation pattern 159 may include a silicon oxide layer. The fixed charge layer 157 may extend onto the second surface 100b of the first substrate 100. The filling insulation pattern 159 may also extend onto the second surface 100b of the first substrate 100.

A doped region 130 may be disposed between the first surface 100a of the first substrate 100 and the pixel isolation pattern 150. The doped region 130 may have the first conductivity type (e.g., a p-type). The doped region 130 may surround a bottom surface of the pixel isolation pattern 150.

A first passivation layer 322 and a second passivation layer 324 may be sequentially provided on the filling insulation pattern 159. Each of the first passivation layer 322 and the second passivation layer 324 may include an inorganic oxide. For example, each of the first passivation layer 322 and the second passivation layer 324 may include silicon oxide.

The light blocking pattern 315 may be disposed on the filling insulation pattern 159. The light blocking pattern 315 may have a grid structure. The light blocking pattern 315 may be disposed on a top surface of the filling insulation pattern 159. The first passivation layer 322 may cover the light blocking pattern 315. The low-refractive index pattern 311 may be disposed on the second passivation layer 324. The low-refractive index pattern 311 may have a grid structure vertically overlapping with the light blocking pattern 315.

Referring to FIGS. 4 and 8B, a pixel isolation pattern 150 may be substantially the same as the pixel isolation pattern 150 of FIG. 8A, and a device isolation pattern 103 may be provided between the first surface 100a of the first substrate 100 and the pixel isolation pattern 150. The device isolation pattern 103 and the pixel isolation pattern 150 may be vertically spaced apart from (e.g., isolated from direct contact with) each other. In other words, a portion of the first substrate 100 may extend between the device isolation pattern 103 and the pixel isolation pattern 150.

Referring to FIGS. 4 and 8C, the pixel isolation pattern 150 may be substantially the same as the pixel isolation pattern 150 of FIG. 8A, and the device isolation pattern 103 may be in contact with (e.g., in direct contact with) the pixel isolation pattern 150. The device isolation pattern 103 may be disposed between the first surface 100a of the first substrate 100 and the pixel isolation pattern 150.

Figure 9:
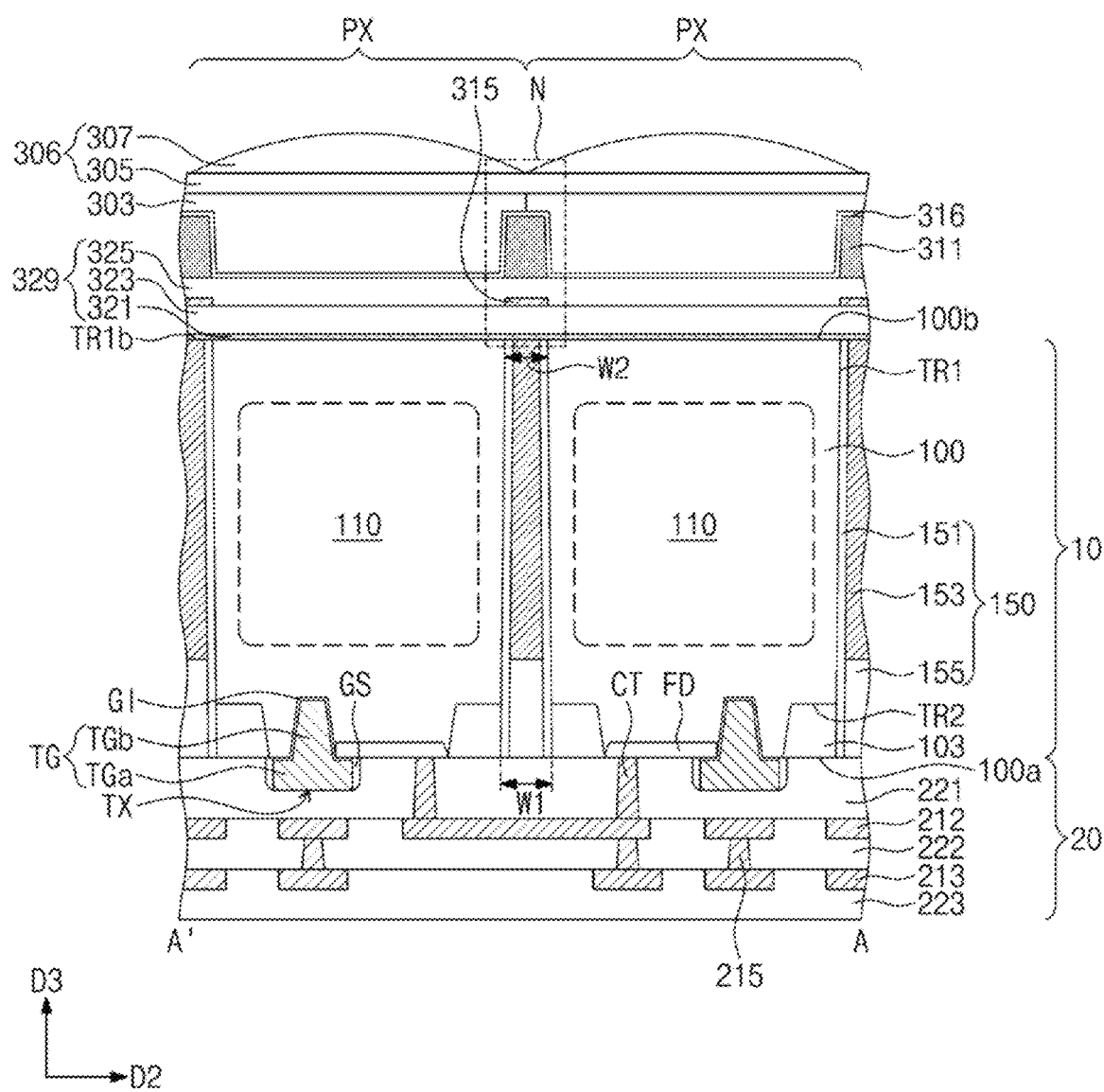
FIG. 9 is a cross-sectional view taken along the line A-A' of FIG. 4 to illustrate an image sensor according to some example embodiments of the inventive concepts.
Figure 10:
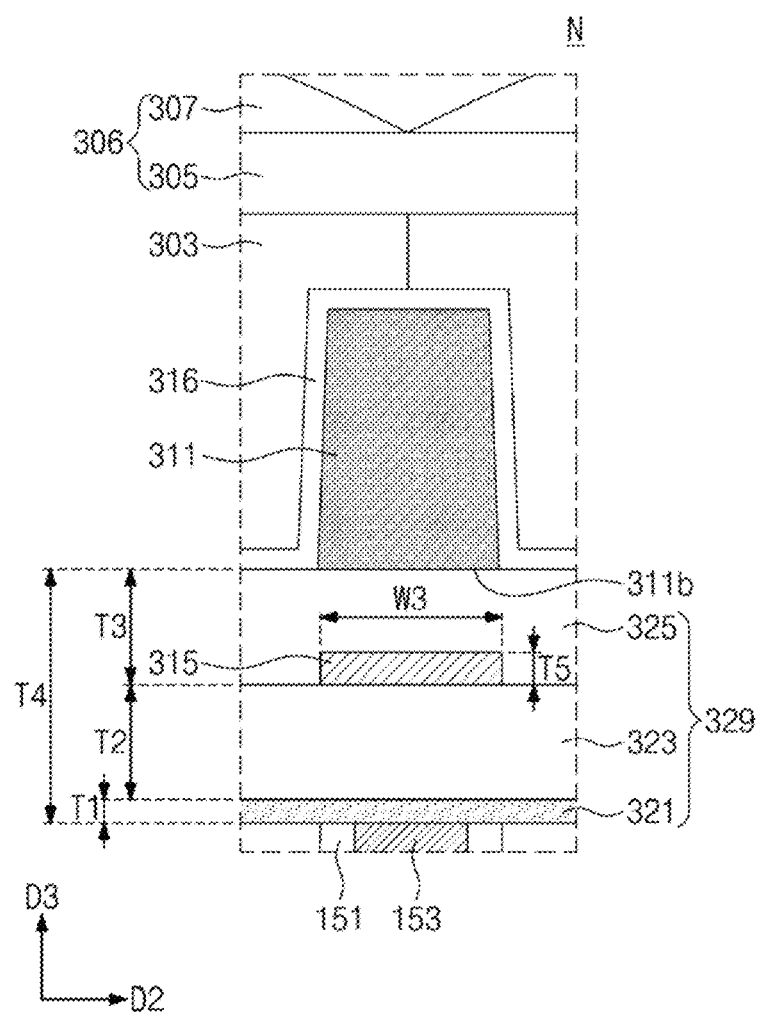
FIG. 10 is an enlarged cross-sectional view of a region 'N' of FIG. 9 according to some example embodiments of the inventive concepts.

FIG. 9 is a cross-sectional view taken along the line A-A' of FIG. 4 to illustrate an image sensor according to some example embodiments of the inventive concepts. FIG. 10 is an enlarged cross-sectional view of a region 'N' of FIG. 9. In the present embodiments, the descriptions to the same features as mentioned with reference to FIGS. 4 to 6 will be omitted and differences between the present embodiments and some example embodiments of FIGS. 4 to 6 will be mainly described, for the purpose of ease and convenience in explanation.

Referring to FIGS. 4, 9 and 10, the light blocking pattern 315 may be disposed on a top surface of the second fixed charge layer 323. The light blocking pattern 315 may be disposed between the second fixed charge layer 323 and the planarization layer 325. The planarization layer 325 may cover the light blocking pattern 315. Even though not shown in the drawings, in some example embodiments, an anti-reflection layer (not shown) may be additionally disposed between the second fixed charge layer 323 and the planarization layer 325. In this case, the anti-reflection layer may cover the light blocking pattern 315.

Figure 11:
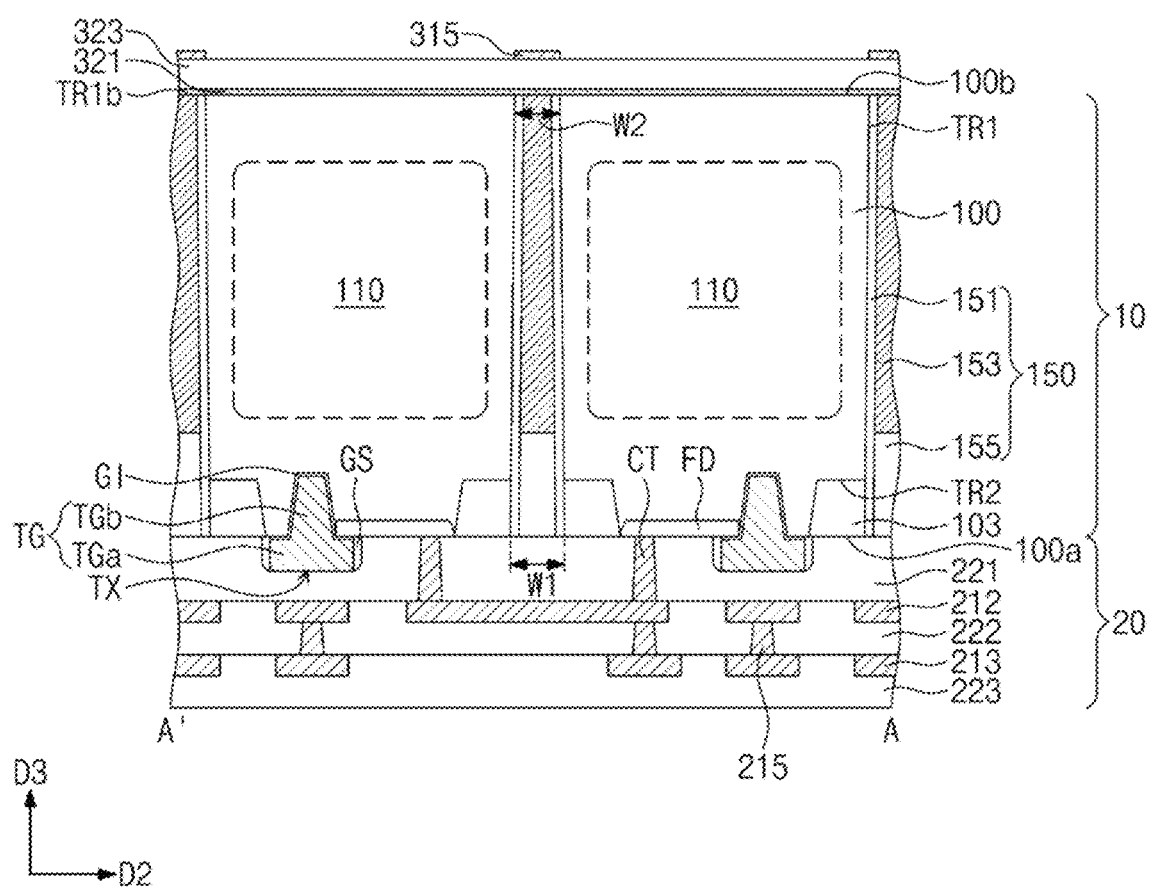
FIG. 11 is a cross-sectional view taken along the line A-A' of FIG. 4 to illustrate a method of manufacturing an image sensor according to some example embodiments of the inventive concepts.

FIG. 11 is a cross-sectional view taken along the line A-A' of FIG. 4 to illustrate a method of manufacturing an image sensor according to some example embodiments of the inventive concepts.

Referring to FIGS. 4 and 11, the resultant structure described with reference to FIG. 7E may be flipped, and then, the first fixed charge layer 321 and the second fixed charge layer 323 may be sequentially formed on the second surface 100b of the first substrate 100.

The light blocking pattern 315 may be formed on the second fixed charge layer 323. The light blocking pattern 315 may vertically overlap with the pixel isolation pattern 150. In other words, the light blocking pattern 315 may have a grid structure.

Referring again to FIGS. 4 and 10, the planarization layer 325 may be formed on the second fixed charge layer 323. The planarization layer 325 may cover the light blocking pattern 315. The first fixed charge layer 321, the second fixed charge layer 323 and the planarization layer 325 may constitute an insulating structure 329. The light blocking pattern 315 may be buried in the insulating structure 329. The first fixed charge layer 321, the second fixed charge layer 323 and the planarization layer 325 may include different materials.

The low-refractive index pattern 311 may be formed on the insulating structure 329. The protective layer 316 may be formed to cover the low-refractive index pattern 311. The color filters 303 may be formed in spaces surrounded by the low-refractive index pattern 311. The micro lens portion 306 may be formed on the color filters 303.

According to the inventive concepts, the light blocking pattern may be buried in the insulating structure and thus may be spaced apart from the low-refractive index pattern. Thus, it is possible to reduce the amount of incident light absorbed by the light blocking pattern. In addition, the light blocking pattern may vertically overlap with the pixel isolation pattern and may be closer to the pixel isolation pattern. Thus, it is possible to reduce the amount of incident light absorbed by the poly-silicon of the pixel isolation pattern. Therefore, the sensitivity of the image sensor may be improved, and the SNR characteristics may be improved. As a result, the optical properties of the image sensor may be improved.

While some example embodiments of the inventive concepts have been particularly shown and described, it will be understood by one of ordinary skill in the art that variations in form and detail may be made therein without departing from the spirit and scope of the attached claims.

What is claimed is:

1. An image sensor, comprising:
a substrate;
a pixel isolation pattern in the substrate and defining unit pixel regions in the substrate;
color filters on the substrate and corresponding to the unit pixel regions, respectively;
a low-refractive index pattern between adjacent color filters of the color filters to at least partially isolate the adjacent color filters from direct contact with each other;
an insulating structure between the substrate and the color filters; and
a light blocking pattern vertically overlapping with the pixel isolation pattern,
wherein the light blocking pattern is within the insulating structure and is isolated from direct contact with the low-refractive index pattern,
wherein a lowermost surface of the low-refractive index pattern is in direct contact with an uppermost surface of the insulating structure.

2. The image sensor of claim 1, wherein the low-refractive index pattern has a grid structure.

3. The image sensor of claim 1, wherein a ratio of a width of the light blocking pattern to a minimum width of the pixel isolation pattern ranges from 0.85 to 1.15.

4. The image sensor of claim 1, wherein the insulating structure comprises: a first fixed charge layer, a second fixed charge layer, and a planarization layer, which are sequentially stacked on the substrate and include different materials.

5. The image sensor of claim 4, wherein the light blocking pattern is on the first fixed charge layer so as to be isolated from direct contact with the pixel isolation pattern.

6. The image sensor of claim 4, wherein a thickness of the first fixed charge layer ranges from 5 nm to 30 nm.

7. The image sensor of claim 4, wherein the light blocking pattern is on the second fixed charge layer.

8. The image sensor of claim 1, wherein a thickness of the light blocking pattern ranges from 5 nm to 10 nm.

9. The image sensor of claim 1, wherein
the light blocking pattern is closer in a vertical direction to the pixel isolation pattern than the low-refractive index pattern, the vertical direction being a direction perpendicular to an upper surface of the substrate, and
a ratio of a thickness of the light blocking pattern to a thickness of the insulating structure ranges from 1/70 to 1/9.

10. An image sensor, comprising:
a substrate having a first surface and a second surface opposite to each other;
a pixel isolation pattern penetrating the substrate and defining a plurality of unit pixel regions in the substrate, the unit pixel regions each including a separate photoelectric conversion region in the substrate;
an insulating structure on the first surface of the substrate;
color filters on the insulating structure;
a low-refractive index pattern on the insulating structure, the low-refractive index pattern at least partially isolating adjacent color filters of the color filters from each other;
a light blocking pattern vertically overlapping with the pixel isolation pattern; and
an interconnection layer on the second surface of the substrate,
wherein a lowermost surface of the low-refractive index pattern is in direct contact with an uppermost surface of the insulating structure, and
wherein the light blocking pattern is isolated from direct contact with the low-refractive index pattern by the insulating structure.

11. The image sensor of claim 10, wherein the light blocking pattern is within the insulating structure.

12. The image sensor of claim 10, wherein
the insulating structure includes a first fixed charge layer, a second fixed charge layer, and a planarization layer, which are sequentially stacked on the first surface of the substrate and include different materials, and
the light blocking pattern is between the first fixed charge layer and the second fixed charge layer.

13. The image sensor of claim 12, wherein
the first fixed charge layer includes one of aluminum oxide, tantalum oxide, titanium oxide, or hafnium oxide, and
the second fixed charge layer includes another of aluminum oxide, tantalum oxide, titanium oxide, or hafnium oxide.

14. The image sensor of claim 12, wherein a thickness of the first fixed charge layer is less than a thickness of the second fixed charge layer.

15. An image sensor, comprising:
a substrate having a first surface and a second surface which are opposite to each other, the substrate including a pixel array region, an optical black region and a pad region;
a pixel isolation pattern in the substrate to define unit pixel regions in the pixel array region of the substrate, the unit pixel regions each having a separate photoelectric conversion region, the pixel isolation pattern including a first isolation pattern and a second isolation pattern, the second isolation pattern being between the first isolation pattern and the substrate;
a device isolation pattern adjacent to the first surface of the substrate, the pixel isolation pattern penetrating the device isolation pattern;
a floating diffusion region adjacent to the first surface of the substrate, the floating diffusion region adjacent to a side of the device isolation pattern;
a gate electrode on the first surface of the substrate;
a gate dielectric layer between the gate electrode and the substrate;
a gate spacer on a side surface of the gate electrode;
an interconnection layer on the first surface of the substrate;
color filters on the second surface of the substrate;
a low-refractive index pattern between adjacent color filters of the color filters to at least partially isolate the adjacent color filters from direct contact with each other;
an insulating structure between the substrate and the color filters, the insulating structure including a first fixed charge layer, a second fixed charge layer, and a planarization layer which are sequentially stacked on the second surface of the substrate and include different materials;
a light blocking pattern vertically overlapping with the pixel isolation pattern;
a protective layer covering the low-refractive index pattern and the insulating structure; and
a micro lens portion on the color filters,
wherein the light blocking pattern is within the insulating structure and is isolated from direct contact with the low-refractive index pattern,
wherein a lowermost surface of the low-refractive index pattern is in direct contact with an uppermost surface of the insulating structure.

16. The image sensor of claim 15, wherein the light blocking pattern is on a top surface of the first fixed charge layer.

17. The image sensor of claim 15, wherein the light blocking pattern is on a top surface of the second fixed charge layer.

18. The image sensor of claim 15, wherein the light blocking pattern includes at least one of titanium, tantalum, tungsten, or titanium nitride.

* * * * *